United States Patent
Chen

(10) Patent No.: US 10,568,183 B2
(45) Date of Patent: *Feb. 18, 2020

(54) MICROCONTROLLER-BASED MULTIFUNCTIONAL ELECTRONIC SWITCH AND LIGHTING APPARATUS HAVING THE SAME

(71) Applicant: Chia-Teh Chen, Taipei (TW)

(72) Inventor: Chia-Teh Chen, Taipei (TW)

(73) Assignee: VAXCEL INTERNATIONAL CO., LTD., Carol Stream, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/402,586

(22) Filed: May 3, 2019

(65) Prior Publication Data

US 2019/0261492 A1    Aug. 22, 2019

Related U.S. Application Data

(63) Continuation of application No. 15/702,871, filed on Sep. 13, 2017, now Pat. No. 10,334,698, which is a (Continued)

(30) Foreign Application Priority Data

Oct. 15, 2012 (TW) .............................. 101137918 A

(51) Int. Cl.
*H05B 37/02* (2006.01)
*H03K 17/56* (2006.01)
(Continued)

(52) U.S. Cl.
CPC ....... *H05B 37/0227* (2013.01); *H03K 17/133* (2013.01); *H03K 17/56* (2013.01);
(Continued)

(58) Field of Classification Search
CPC . H05B 33/0854; H05B 37/02; H05B 37/0281
(Continued)

(56) References Cited

U.S. PATENT DOCUMENTS

| | | |
|---|---|---|
| 4,322,637 A | 3/1982 | Takasago |
| 4,461,977 A | 7/1984 | Pierpoint |

(Continued)

*Primary Examiner* — Thuy V Tran
(74) *Attorney, Agent, or Firm* — Li & Cai Intellectual Property (USA) Office

(57) ABSTRACT

An inter-linkable LED security light is disclosed which is configured with an LED load, a detection device, a switching circuitry, a microcontroller and a wireless transmitter. When an external control signal is detected by the detection device, the external control signal is converted into a message carrying sensing signal and the microcontroller responsively operates to output a control signal to turn on the security light for a predetermined time duration, synchronously the microcontroller also manages to transmit the message sensing signal thru the wireless transmitter to control the same lighting performance of at least one neighboring light. The detection device is optionally an active infrared ray motion sensor, a passive infrared ray motion sensor, an ultrasonic wave sensor, a microwave sensor capable of detecting a motion intrusion or a photo sensor capable of detecting a light intensity of a detection area where the lighting apparatus is positioned.

35 Claims, 16 Drawing Sheets

Related U.S. Application Data continuation of application No. 15/161,902, filed on May 23, 2016, now Pat. No. 9,795,007, which is a continuation of application No. 14/579,174, filed on Dec. 22, 2014, now Pat. No. 9,380,680, which is a continuation of application No. 13/792,002, filed on Mar. 9, 2013, now Pat. No. 8,947,000.

(51) Int. Cl.

| | | |
|---|---|---|
| *H03K 17/78* | (2006.01) | |
| *H03K 17/13* | (2006.01) | |
| *H03K 17/94* | (2006.01) | |
| *H05B 39/08* | (2006.01) | |
| *H05B 33/08* | (2020.01) | |

(52) U.S. Cl.
CPC ............ *H03K 17/78* (2013.01); *H03K 17/941* (2013.01); *H05B 37/0272* (2013.01); *H05B 39/08* (2013.01); *H05B 33/0854* (2013.01); *H05B 37/0281* (2013.01); *Y02B 20/42* (2013.01); *Y02B 20/44* (2013.01); *Y02B 20/46* (2013.01); *Y10T 307/766* (2015.04); *Y10T 307/773* (2015.04); *Y10T 307/826* (2015.04); *Y10T 307/858* (2015.04)

(58) Field of Classification Search
USPC .................. 315/159, 360, 362; 340/541, 567
See application file for complete search history.

(56) References Cited

U.S. PATENT DOCUMENTS

| | | |
|---|---|---|
| 5,142,134 A | 8/1992 | Kunkel |
| 5,235,315 A | 8/1993 | Cherry et al. |
| 5,442,177 A | 8/1995 | Boulos et al. |
| 5,637,863 A | 6/1997 | Sanborn et al. |
| 5,946,209 A | 8/1999 | Eckel et al. |
| 6,285,140 B1 | 9/2001 | Ruxton |
| 6,294,873 B1 | 9/2001 | Yu |
| 7,005,806 B2 | 2/2006 | Shih |
| 7,417,378 B2 | 8/2008 | Kim |
| 7,566,859 B2 | 7/2009 | Shih |
| 7,804,252 B2 * | 9/2010 | Chen .................. H05B 37/0218 315/152 |
| 8,035,513 B2 | 10/2011 | Raper |
| 8,310,163 B2 | 11/2012 | Chen |
| 8,598,805 B2 | 12/2013 | Tremblay et al. |
| 8,735,826 B2 | 5/2014 | Lee et al. |
| 8,866,392 B2 * | 10/2014 | Chen .................. H05B 33/0818 315/152 |
| 9,035,568 B2 | 5/2015 | Ganton et al. |
| 9,743,480 B2 | 8/2017 | Chen |
| 9,826,590 B2 | 11/2017 | Chen |
| 10,165,643 B2 | 12/2018 | Chen |
| 2006/0261741 A1 | 11/2006 | Hwang |
| 2013/0049610 A1 | 2/2013 | Chen |
| 2013/0257315 A1 | 10/2013 | Restrepo et al. |
| 2014/0159877 A1 | 6/2014 | Huang |
| 2015/0303687 A1 | 10/2015 | Yseboodt et al. |

* cited by examiner

| Brand | $V_F$ Min. | $V_F$ Max. | Product Series | Information Source |
|---|---|---|---|---|
| CREE | 2.9V | 3.3V | J Series LEDs/J Series 2835 | www.cree.com/led-components/products/j2835/jseries-2835 |
| LUMILEDS | 2.7V | 3.3V | LUXEON 2835 Line | www.lumileds.com/luxeon2835line |
| SAMSUNG | 2.9V | 3.3V | KM281BA+ | www.samsung.com/app/components/products/j2835/jseries-2835 |
| OSRAM | 2.7V | 3.3V | DURIS® E/DURISR E 2835 | www.osram.com/app/product_selector/#!?query=DORIS%20E%202835&sortField=&sortOrder=&start-0&filters=productbrand,DORIS,E&filters-productbrand,DORIS |

FIG. 12

MICROCONTROLLER-BASED MULTIFUNCTIONAL ELECTRONIC SWITCH AND LIGHTING APPARATUS HAVING THE SAME

CROSS-REFERENCE TO RELATED APPLICATIONS

This Application is a continuation application of prior application Ser. No. 15/702,871 filed on Sep. 13, 2017, now U.S. Pat. No. 10,334,698, the entire contents of which are incorporated herein by reference. The prior application Ser. No. 15/702,871 filed on Sep. 13, 2017 is a continuation application of prior application Ser. No. 15/161,902 filed on May 23, 2016, now U.S. Pat. No. 9,795,007. The prior application Ser. No. 15/161,902 filed on May 23, 2016 is a continuation application of prior application Ser. No. 14/579,174 filed on Dec. 22, 2014, now U.S. Pat. No. 9,380,680 B2, the prior application Ser. No. 14/579,174 filed on Dec. 22, 2014 is a continuation application of U.S. Pat. No. 8,947,000 B2.

BACKGROUND

1. Technical Field

The present disclosure relates to a technology using a microcontroller with program codes designed to provide a user friendly solution for performing on/off switch control, diming control, and timer management for a lighting apparatus or an electrical appliance.

2. Description of Related Art

A mechanical-type electric switch is a manually operated electromechanical device. Its function is based on attaching or detaching two metal conductors to produce a short or open circuit, respectively. This mechanical-type switch is not suitable for installing in a space where has the concern of gas explosion, because an instantaneous surge current, produced by suddenly engaging or releasing the metallic contact of the switch, may generate electric sparks to ignite fire.

A controllable semiconductor switching element, such as a triac, has nearly zero voltage between two output-electrodes in conduction mode and nearly zero current through two output-electrodes in cut-off mode. Solid state electronic switch utilizing the above unique features of triac for circuit on/off switch control can avoid generating electric arc, since the main current pathway of the solid-state switch is not formed by engaging the two metal conductors. It becomes a much better choice than mechanical-type electric switch from the stand point of safety consideration.

Solid-state electronic switches are constructed with various methods to trigger controllable switching element, like triac or thyristor, into conduction or cutoff for desired electric power transmission. For example, U.S. Pat. No. 4,322,637 disclosed a technique using optical coupling element to control bi-directional thyristor or triac in conduction or off state; or another U.S. Pat. No. 6,285,140B1 disclosed a technique using microcontroller incorporated with zero-crossing-point detector to generate AC-synchronized time-delay pulse to control triac in on or cut-off state so as to transmit variable electric power to a light-emitting diode load.

Mostly a mechanical toggle or spring button of similar setup is usually applied on the electronic switch to facilitate manual on/off switch operation. The operation of electronic switch with mechanical toggle means an inevitable contact by hand which is not appropriate in working places such as kitchens or hospitals. To relieve concerns of contagion or contamination resulted through hand contacts, touchless switches are developed. For example, U.S. Pat. No. 5,637,863 disclosed a technique utilized infrared sensor to activate electronic switch to operate on/off switch control, and even dimming control presumably by modifying its circuit design.

In retrospect, the above mentioned prior arts have however still some drawbacks. For instance, U.S. Pat. No. 5,637,863 used a complicated infrared sensor construction and circuit design; or U.S. Pat. No. 6,285,140B1 did not resort to an efficient control of electric power transmission from power source to various electric impedances which is required in lighting apparatus.

SUMMARY

An exemplary embodiment of the present disclosure provides a multifunctional electronic switch which utilizes a microcontroller to perform at least two functions, which are on/off switch control and dimming control or power transmission level control, for a lighting apparatus or an electric appliance. The multifunctional electronic switch comprises a microcontroller, a detection means and a controllable semiconductor switching element. The controllable semiconductor switching element is connected between a load and a power source in a serial fashion. The detection means detects an external control signal and converts the outcome into message carrying low voltage sensing signals readable to the microcontroller. The microcontroller operates according to specific format of the sensing signals the controllable semiconductor switching element in on/off switch mode or in dimming control mode so as to transmit whole/zero electric power, or to transmit dimmed electric power, from the power source to the load.

An exemplary embodiment of the present disclosure provides a microcontroller based electronic switch for detecting an external control signal. The microcontroller based electronic switch comprises a detection means, a microcontroller, and a controllable switching element. The controllable switching element is electrically connected between a power source and a load. The detection means is used for detecting the external control signal played by the user and converting the external control signal into a message carrying sensing signal. The microcontroller with program codes written and designed to read and interpret the message carrying sensing signal generated by the detection means, wherein the microcontroller is electrically connected between the controllable switching element and the detection means. The microcontroller controls the conduction state or cutoff state of the controllable switching element according to the message carrying sensing signal generated by the detection means. When the controllable switching element is in a conduction state, the microcontroller further controls electric power transmission level from the power source to the load according to the time length of the message carrying sensing signal received from the detection means.

An exemplary embodiment of the present disclosure provides a microcontroller based electronic switch connected between a load and a DC power source. The microcontroller based electronic switch controls the conduction rate between the load and the DC power source. The microcontroller based electronic switch comprises a detection means, a microcontroller, and an uni-directional controllable semiconductor switching element. The uni-directional controllable semiconductor switching element is connected between the load and the DC power source. The detection means is used for detecting the external control signal played by the user and converting said external control signal into a message carrying sensing signal. The microcontroller is connected between the uni-directional controllable semiconductor switching element and the detection means. The microcontroller produces a pulse-width-modulation voltage signal according to the message carring sensing signal, so as to control a conduction or cut-off state of the uni-directional controllable semiconductor switching element. When the uni-directional controllable semiconductor switching element is in conduction state, the microcontroller controls electric power transmission level according to the message carrying sensing signal, wherein the electric power is supplied to the load from the DC power source.

An exemplary embodiment of the present disclosure provides a microcontroller based electronic switch connected between a load and an AC power source. The microcontroller based electronic switch controls the conduction rate between the load and the AC power source. The microcontroller based electronic switch comprises a detection means, a microcontroller, a zero-crossing-point detector and a bi-directional controllable semiconductor switching element. The bi-directional controllable semiconductor switching element is connected between the load and the AC power source. The detection means is used for detecting the external control signal played by the user and converting said external control signal into a message carrying sensing signal. The zero-crossing-point detector is connected between the microcontroller and the AC power source. The microcontroller is connected, respectively, to the detection means, the zero-crossing-point detector, and the bi-directional controllable semiconductor switching element. The microcontroller generates zero-crossing-point time-delay pulse or zero voltage, respectively, to control the conduction or cut-off state of the bi-directional controllable semiconductor switching element according to the message carrying sensing signal. When the bi-directional controllable semiconductor switching element is in conduction state, the microcontroller controls electric power transmission level according to the time length of the message carrying sensing signal, wherein the electric power is supplied to the load from the AC power source.

To sum up, the present disclosure is characteristic in, a touchless or a direct touch interface between the user and the multifunctional electronic switch is created to implement at least two operation modes of the electronic switch by using software codes written in OTPROM(one-time programmable read only memory) of microcontroller to analyze the message carrying sensing signals.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 12 is a data sheet showing data of the minimum forward voltages and maximum forward voltages collected from various LED manufacturers.

DESCRIPTION OF THE EXEMPLARY EMBODIMENTS

Figure 1:
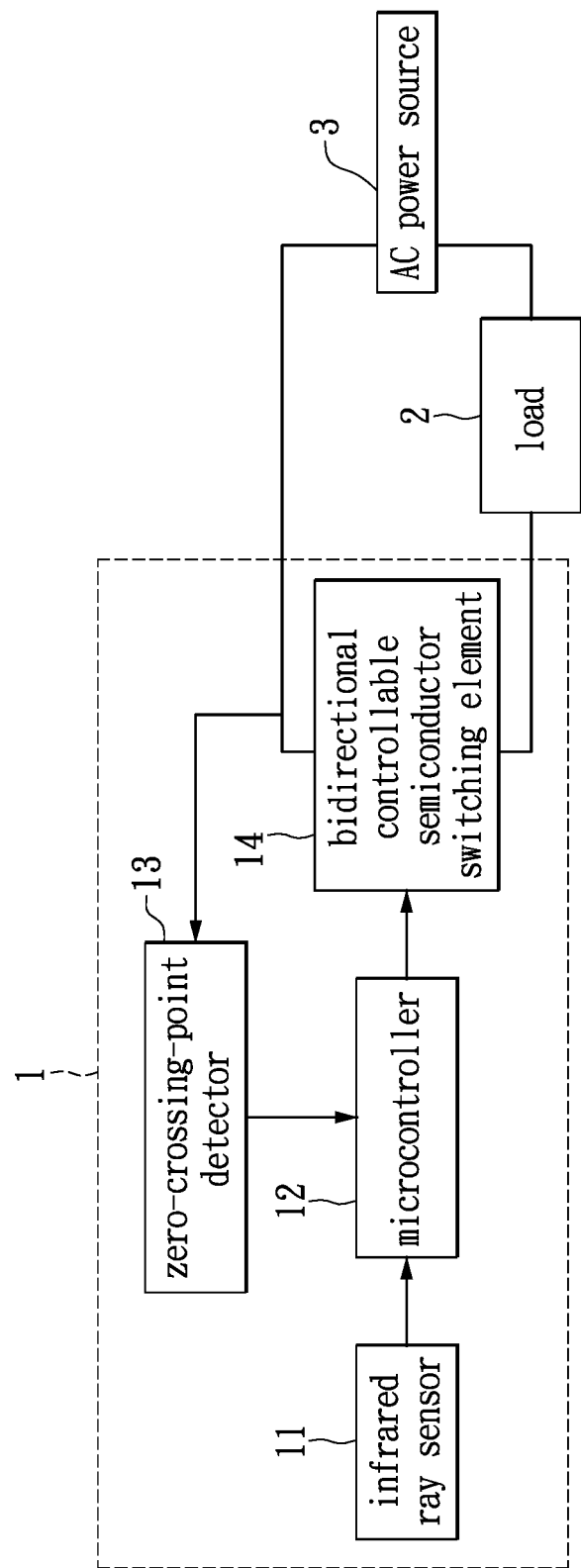
FIG. 1 is a block diagram of a microcontroller based electronic switch using an infrared ray sensor as a detection means applied for an AC power source according to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Referring to FIG. 1, FIG. 1 is a block diagram of a microcontroller based electronic switch using an infrared ray sensor as a detection means applied for an AC power source according to an exemplary embodiment of the present disclosure. A microcontroller based electronic switch 1 is connected in series to an AC power source 3, and is further connected to a load 2, so as to control AC power delivered to the load 2. The microcontroller based electronic switch 1 comprises at least an infrared ray sensor 11, a microcontroller 12, a zero-crossing-point detector 13, and a bi-directional controllable semiconductor switching element 14. The infrared ray sensor 11 is connected to one pin of microcontroller 12 to transmit a low voltage sensing signal to the microcontroller 12. The zero-crossing-point detector 13 is connected to another pin of microcontroller 12 and is also electrically coupled to the AC power source 3 to produce AC power synchronized signals which are fed to the microcontroller 12. The microcontroller 12 through its one designated pin is electrically connected to the control electrode of the bi-directional controllable semiconductor switching element 14 so as using appropriate conduction phase to control the electrical conduction state of the bi-directional controllable semiconductor switching element 14.

The infrared ray sensor 11 detects object motions coming from the user and converts the detected result into message carrying low voltage sensing signals readable to the microcontroller 12. The microcontroller 12 decodes the low voltage sensing signals (message carrying low voltage sensing signals) according to the program designed and written in its OTPROM (one-time programmable read only memory) memory. The microcontroller 12 is with program codes written and designed to read and interpret the message carrying sensing signal generated by the infrared ray sensor 11. The infrared ray sensor 11 is an exemplary embodiment for a detection means to detect the external motion signal played by the user and convert the external motion signal into a message carrying sensing signal. The microcontroller 12 recognizes the working mode that the user has chosen and proceeds to execute the corresponding loop of subroutine for performance. Each working mode is defined in the software codes with loops of subroutine for execution.

One working mode is on/off switch control mode. In this working mode, according to the low voltage sensing signal from the infrared ray sensor 11, the microcontroller 12 operates the bi-directional controllable semiconductor switching element 14 in conduction state or cut-off state alternatively. More specifically, in this working mode, together with the zero-crossing-point detector 13, the microcontroller 12 generates voltage pulses synchronized with the AC power source 3 to trigger the bi-directional controllable semiconductor switching element 14 to be in conduction state, such that a fixed electric power can be sent to the load 2; or the microcontroller 12 generates a zero voltage to set the bi-directional controllable semiconductor switching element 14 to be in cut-off state, and thereby ceases to transmit the fixed electric power to the load 2.

Another working mode is dimming control mode about controlling different levels of electric power transmission to the load 2 by controlling the conduction rate of the bi-directional controllable semiconductor switching element 14. Using the synchronized signals produced by the zero-crossing-point detector 13 as a reference, the microcontroller 12 generates phase delay voltage pulses synchronized with the AC power source 3 to trigger the conduction of the bi-directional controllable semiconductor switching element 14 to transmit electric power to the load 2. Responding to the low voltage sensing signals from the infrared ray sensor 11, the microcontroller 12 continuously changes the phase delay time of the triggering pulses during each cycle period of the AC power source 3. Consequently, the conduction rate of the bi-directional controllable semiconductor switching element 14 is gradually changed. The power level of the load 2 is therefore managed by the low voltage sensing signals from the infrared ray sensor 11 which are generated according to the user's intention, wherein when the bi-controllable semiconductor switching element 14 is in conduction state, the microcontroller further controls the electric power transmission level from the AC power source 3 to the load 2 according to low voltage sensing signals from the infrared ray sensor 11.

Figure 2:
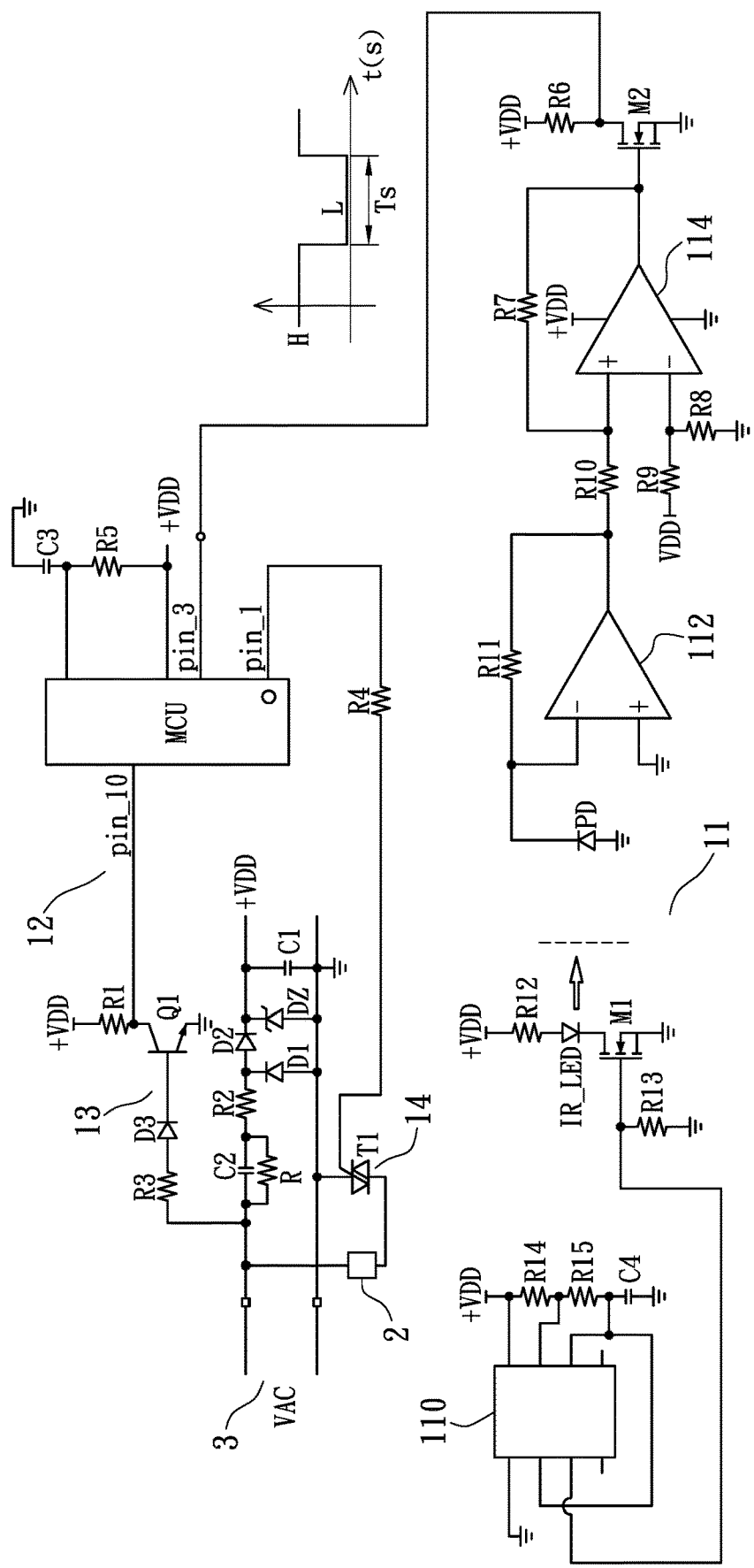
FIG. 2 is a circuit diagram of a microcontroller based electronic switch using an infrared ray sensor applied for an AC power source according to an exemplary embodiment of the present disclosure.

Referring to FIG. 1 and FIG. 2, FIG. 2 is a circuit diagram of a microcontroller based electronic switch applied for an AC power source according to an exemplary embodiment of the present disclosure. The microcontroller based electronic switch 1 is connected through a bi-directional controllable semiconductor switching element 14 to the AC power source 3 and the load 2 in a serial fashion. A voltage VDD for the circuit system is generated by conventional voltage reduction and rectification from the AC power 3. The output stage of the infrared ray sensor 11 is a transistor M2. The drain of the transistor M2 is connected to a pin pin_3 of the microcontroller 12 to deliver low voltage sensing signals to the microcontroller 12.

The zero-crossing-point detector 13 is composed of a transistor Q1 and a diode D3. The collector of the transistor Q1 is connected to a pin pin_10 of the microcontroller 12, the base of the transistor Q1 is connected to a conducting wire of the AC power source 3 through the diode D3 and a resistor R3. In the positive half-cycle for AC power source 3, the transistor Q1 is saturated conducting, and the voltage at the collector of the transistor Q1 is close to zero. In the negative half-cycle for AC power source 3, the transistor Q1 is cut-off, and the voltage at the collector of the transistor Q1 is a high voltage of VDD. Corresponding to the sine wave of the AC power source 3, the zero-crossing-point detector 13 generates therefore signals of square wave alternatively with a low voltage and a high voltage through the collector of the transistor Q1. The square wave is synchronized with the AC power source 3 and sent to a pin pin_10 of the microcontroller 12 for the purpose of controlling conduction phase, and the details thereof are described later. In practice, the bi-directional controllable semiconductor switching element 14 can be a triac T1, the pin pin_1 of the microcontroller 12 is connected to the gate of the triac T1 to control the conduction or cut-off state of the triac T1, or to control the conduction rate of the triac T1.

Still referring to FIG. 2, the infrared ray sensor 11 comprises a transmitting circuit and a receiving circuit. In the transmitting circuit, an infrared light-emitting diode IR_LED is connected to the drain of the transistor M1 in a serial fashion, and the gate of the transistor M1 is connected to an output of the timer 110. In practice, the timer 110 can be a 555 timer IC. The 555 timer IC generates a square-wave with a frequency of about 3 kHz to modulate the drain current of the transistor M1, such that the infrared light-emitting diode IR_LED provides an infrared light signal with a square wave form which is severed as the light source of the infrared ray sensor.

The receiving circuit is an infrared light detection circuit and comprises a photosensitive diode PD, two serially connected amplifiers 112, 114, and a transistor M2. The drain of the transistor M2 is connected to a pin pin_3 of the microcontroller 12. In practice, the amplifiers 112 and 114 can be LM324 operational amplifier. The combination of the amplifier 114 and resistors R7 through R10 is a Schmitt trigger circuit having a threshold voltage, and the threshold voltage is produced by the voltage divider composed by resistors R8 and R9. The Schmitt trigger circuit makes possible a high discrimination of a true detection to a false one.

The photosensitive diode PD is used to receive the infrared light signal from the transmitting circuit. If the output voltage of the amplifier 112 exceeds the threshold voltage, the amplifier 114 produces a high voltage applied to the gate of the transistor M2, such that the transistor M2 is turned on. Therefore, the drain of the transistor M2 provides a low voltage sensing signal which is close to zero voltage, and the time length of the low voltage sensing signal is related to the time period the infrared ray is detected.

In addition, if the photosensitive diode PD does not receive the infrared light signal, the output voltage of the amplifier 112 is lower than the threshold voltage, and then the amplifier 114 provides a low voltage to the gate of the transistor M2, such that the transistor M2 is turned off. Therefore, the drain of the transistor M2 provides a high voltage of VDD. In other words, the pin pin_3 of the microcontroller 12 receives either a low voltage sensing signal or a high voltage depending on whether the infrared ray sensor 11 detects the infrared light or not, wherein the time length of the low voltage sensing signal is about the time period within which the infrared light is detected.

Figure 3B:
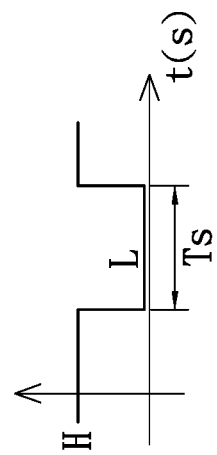
FIG. 3B is a waveform diagram showing a low voltage sensing signal according to an exemplary embodiment of the present disclosure.
Figure 3A:
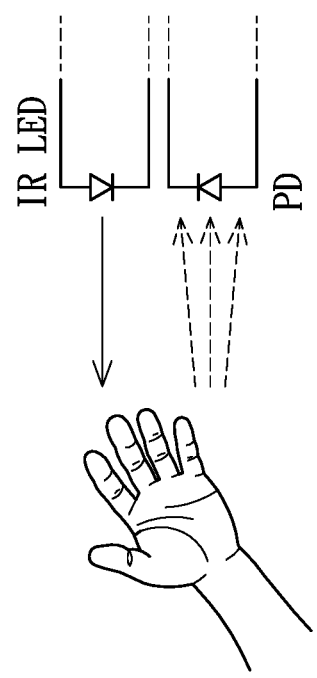
FIG. 3A is a schematic diagram showing a practical operation of an infrared ray sensor associated with a microcontroller based electronic switch according to an exemplary embodiment of the present disclosure.

In other words, the infrared ray sensor 11 generates a sensing signal which is characterized by a low voltage within a time length. The sensing signal with a specific time length of low voltage can be considered as a sensing signal format which carries message to make the microcontroller 12 to operate in one of at least two working modes accordingly, wherein one working mode is on/off switch control mode and the another one is dimming control mode to control the conduction rate of the bi-directional controllable semiconductor switching element 14. Referring to FIG. 2, FIG. 3A and FIG. 3B, FIG. 3A is a schematic diagram showing a practical operation of an infrared ray sensor associated with a microcontroller based electronic switch according to an exemplary embodiment of the present disclosure, and FIG. 3B is a waveform diagram showing a low voltage sensing signal according to an exemplary embodiment of the present disclosure. In FIG. 3A, the infrared light-emitting diode IR_LED is parallel arranged to the photosensitive diode PD without accurate alignment. When an object, here is a human hand, moves in front of the infrared light-emitting diode IR_LED, the infrared light emitted from the infrared light-emitting diode IR_LED scatters from the object surface onto the photo sensing surface of the photosensitive diode PD.

FIG. 3B shows a waveform of the low voltage sensing signal provided from the infrared ray sensor 11. If the photosensitive diode PD does not receive the infrared light scattered from the target object surface, or the intensity of the infrared light received by the photosensitive diode PD is insufficient, the drain of the transistor M2 provides a high voltage H of VDD. Within an appropriate distance, the photosensitive diode PD receives the infrared light scattered from the object surface, and the intensity of the received infrared light is enough to cause the output voltage of the amplifier 112 exceeding the threshold voltage, the amplifier 114 produces a high voltage, such that the transistor M2 is turned on, and the drain of the transistor M2 provides a signal with a low voltage L of about zero volt. In other words, when the infrared ray sensor 11 detects an object, most commonly user's hand, purposefully entering the infrared ray detecting zone, the infrared ray sensor 11 generates a low voltage sensing signal, by contrast when an object is not within the infrared ray detecting zone, the infrared ray sensor 11 generates a high voltage. The infrared ray sensor 11 comprising a means for emitting infrared light to form the defined infrared ray detecting zone, a means for detecting infrared light reflected from the object moving into the infrared ray detecting zone.

The appropriate distance or the infrared ray detecting zone is defined as an effective sensing range or area of the infrared ray sensor 11. In FIG. 3B, the time length Ts of the low voltage L is approximately equal to the time period that an object stays within the infrared ray detecting zone, wherein the time period is about a few tenths through a few seconds. When the object leaves the infrared ray detecting zone, the signal delivered from the infrared ray sensor 11 changes from a low voltage L to a high voltage H, as shown in FIG. 3B. Hence the sensing signal generated from the infrared ray sensor 11 is a binary signal readable to the program written in the OTPROM memory of the microcontroller 12. The microcontroller based electronic switch 1 utilizes specific sensing signal format characterized by the time length Ts of the low voltage sensing signal to implement at least two functions, namely, on/off switch control and dimming control. By introducing a preset time To, the microcontroller 12 can execute subroutine corresponding to the functions of the on/off switch control and the dimming control determined by a comparison scheme of the time length Ts with the preset time To. The user can therefore operates the microcontroller-based electronic switch 1 in a convenient manner simply by moving his hand into or out of the infrared ray detecting zone of the infrared ray sensor 11, and staying his hand there for a time period to select desired performance function.

Figure 4:
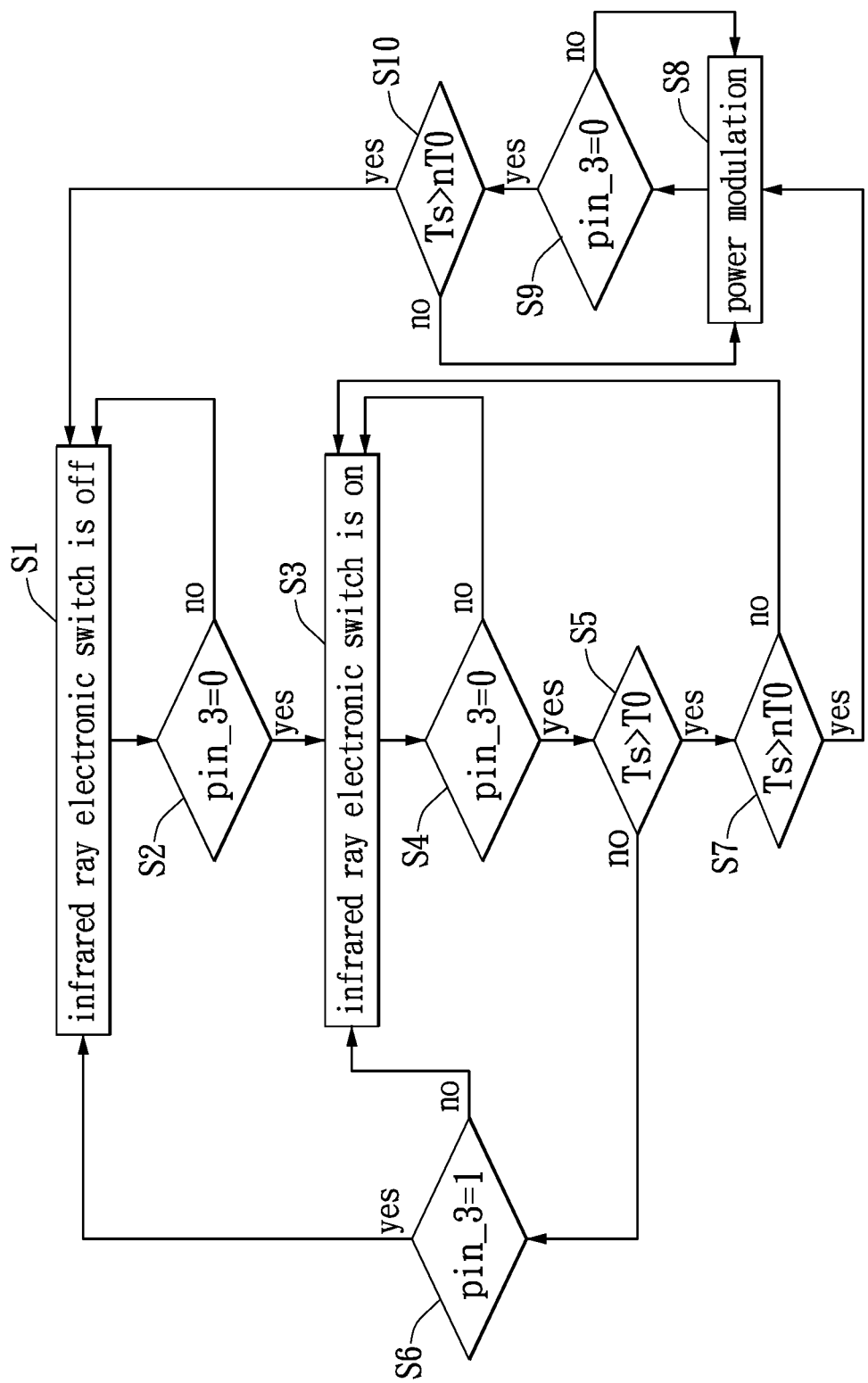
FIG. 4 is a flow chart of a program executed in a microcontroller based electronic switch according to an exemplary embodiment of the present disclosure.

Referring to FIG. 2, FIG. 3 and FIG. 4, FIG. 4 is a flow chart of a program executed in a microcontroller of a microcontroller based electronic switch according to an exemplary embodiment of the present disclosure. The program written in the OTPROM memory of the microcontroller 12 includes several subroutine loops. These loops are started from the loop of steps S1 through S6 of the on/off switch control mode, and may jump into the loop of steps S8 through S10 of the dimming control mode according to the time length Ts of the low voltage sensing signal. The pin pin_3 of the microcontroller 12 receives a high voltage H or a low voltage L from the infrared ray sensor 11, wherein the time length Ts of the low voltage sensing signal is about the time length which the user's hand stays within the infrared ray detecting zone.

The program of the microcontroller 12 starts its execution from the loop of steps S1 and S2 in which the microcontroller based electronic switch 1 is off. The program of the microcontroller 12 scans the voltage at the pin pin_3 of the microcontroller 12. If the voltage at the pin pin_3 of the microcontroller 12 is high (bit 1), the program of the microcontroller 12 stays in the loop of steps S1 and S2 that the microcontroller based electronic switch 1 is off. On the contrary, if the voltage at the pin pin_3 is low (bit 0), the program of the microcontroller 12 jumps into the loop of steps S3 through S6 in which the microcontroller based electronic switch 1 is on. At step S4 when the microcontroller based electronic switch 1 is on, the program of the microcontroller 12 scans the voltage at the pin pin_3 of the microcontroller 12. If the voltage at the pin pin_3 of the microcontroller 12 is low (bit 0), the program of the microcontroller 12 jumps to step S5 to compare the time length Ts with a preset time To. In practice, the preset time To is between 1 through 3 seconds, but the present disclosure is not limited thereto.

At step S5, the program of the microcontroller 12 check the time length Ts, if Ts is shorter than the preset time To, step S5 proceeds to step S6 to detect whether the voltage at the pin pin_3 is momentary a high voltage H (bit 1). At step S6, if the voltage at the pin pin_3 is the voltage H, the program goes back to the loop of steps S1 and S2 in which the microcontroller based electronic switch 1 is off. At step S6, if the voltage at the pin pin_3 is low, the program remains in the loop of steps S3 through S6 in which the microcontroller based electronic switch 1 is on.

To sum up, the on/off switch control mode is described by the loops consisting of steps S1 through S6 that the microcontroller based electronic switch 1 is operated in off- and on-state rotationally. The microcontroller based electronic switch 1 is on or off according to whether the user moves his hand into and then pulls out the infrared ray detecting zone of the infrared ray sensor 11 within the preset time To.

At step S5, the program of the microcontroller 12 check the time length Ts, if the time length Ts is longer than the preset time To, the program jumps to step S7 to detect whether the time length Ts is longer than n times the preset time To (n≥2). At step S7, if the time length Ts is not longer than n times the preset time To, the program goes back to the loop of steps S3 through S6 that the microcontroller based electronic switch 1 remains on. At step S7, if the time length Ts is longer than n times the preset time To, the program jumps into a loop consisting of steps S8 through S10 to execute a subroutine for the dimming control mode of microcontroller based electronic switch 1. FIG. 4 does not show the details of subroutine associated with the dimming control mode, but the process is described in short as follows. At step 9, the program of the microcontroller 12 scans the voltage at the pin pin_3 of the microcontroller 12. The program proceeds to step 10 from Step 9, if the voltage at the pin pin_3 is low. At step 10, the subroutine of the microcontroller 12 checks if Ts>nTo. If the voltage at the pin pin_3 is low for several times, and the time lengths denoted by Ts or Ts' are shorter than n times the preset time To, the subroutine remains in the rotation loop defined by step 8 through S10, and microcontroller 12 continuously increases or decreases the electric power transmission to the load 2 by controlling the conduction rate. If the electric power of the load 2 reaches the maximum or minimum electric power, the program of the microcontroller 12 responds no more to the low voltage sensing signal. At step 10, if the time length Ts is longer than n times the preset time To, the program of the microcontroller 12 jumps back to the loop of steps S1 and S2 in which the microcontroller based electronic switch 1 is off. Then, the program of the microcontroller 12 resumes itself from steps S1 and S2 in a rotational manner to execute the subroutines represented by the steps shown in FIG. 4.

In the exemplary embodiment of FIG. 2, the preset time To and the number n can be set 2 seconds and 2, respectively. Referring to the steps executed by the microcontroller 12 in FIG. 4, if the detected time length Ts of the low voltage sensing signal at the pin pin_3 is less than 2 seconds, that means the time period which the hand stays within the infrared ray detecting zone is less than 2 seconds, the microcontroller 12 remains in the current function mode. If the detected time length Ts at the pin pin_3 is longer than 4 seconds, that means the time length which the hand stays within the infrared ray detecting zone is longer than 4 seconds, the microcontroller 12 changes the current function mode to another one function mode. In other words, if the time length Ts of the low voltage sensing signal is shorter than the preset time To, the microcontroller 12 operates either in on/off switch mode or in dimming mode. If the detected time length Ts of the low voltage sensing signal is longer than n times the preset time To, the microcontroller 12 changes its program execution from the on/off switch mode into the dimming control mode and vice versa.

In addition, the concept of the present disclosure can be further extended to implement a multifunctional electronic switch having at least three functions built in one, which are on/off switch control, dimming control and timer management. The program written in the OTPROM memory of the microcontroller can be modified in such a manner that the microcontroller responds not only to the low voltage sensing signal of the infrared ray sensor, but also to a specific sequence of the sensing signals. The microcontroller executes subroutines of working modes corresponding to the said three functions according to the detected time length Ts and special sequence of the low voltage sensing signals. The first working mode is on/off switch control mode used to control the conduction or cut-off state of the controllable semiconductor switching element. The second working mode is dimming control mode used to control the conduction rate of the controllable semiconductor switching element. The third working mode is timer management mode used to momentarily delay and gradually turn off the controllable semiconductor switching element. When the infrared ray sensor generates a low voltage sensing signal within the preset time To, the microcontroller operates in the on/off switch mode by controlling the conduction or cut-off state of the controllable semiconductor switching element alternately. If the time length Ts of the low voltage sensing signal is longer than n times the preset time To, the microcontroller changes its operation from the on/off switch control mode to the dimming control mode. Once in the dimming control mode, the microcontroller executes subroutine to gradually change the conduction rate of the controllable semiconductor switching element from the maximum conduction rate to the minimum conduction rate, and then to gradually change the conduction rate from the minimum conduction rate to the maximum conduction rate for completing a dimming cycle. In the dimming cycle, the moment when the infrared ray sensor provides a high voltage is a dimming end point. According to the dimming control mode design, the microcontroller locks the conduction rate of the controllable semiconductor switching element at the dimming end point. Thereafter, if the infrared ray sensor generates a plurality of low voltage sensing signals, for instance, a plural signal of two consecutive sensing signals, each within the preset time To, the microcontroller operates in the timer management mode by executing a subroutine to momentarily delay and gradually to turn off the controllable semiconductor switching element. It is clear to see the advantage of the present disclosure to integrate various switch control functions in one without changing the hardware circuit design. All are simply done by defining the format of sensing signals and by modifying the program written in the OTPROM memory in the microcontroller.

Figure 5:
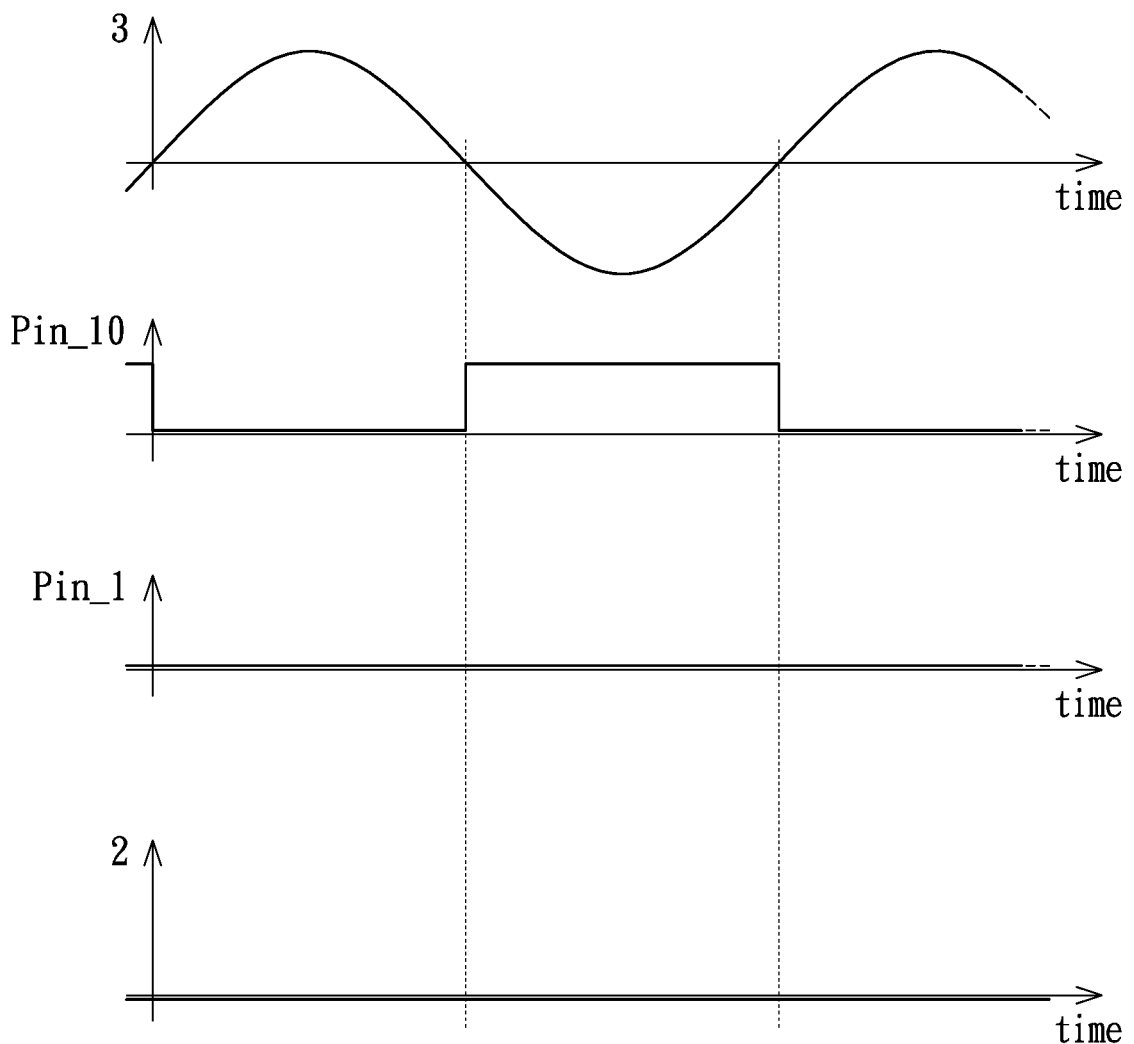
FIG. 5 is a voltage waveform diagram of a microcontroller based electronic switch when the electronic switch operating in the on/off switch control mode is in cut-off state according to an exemplary embodiment of the present disclosure.
Figure 6:
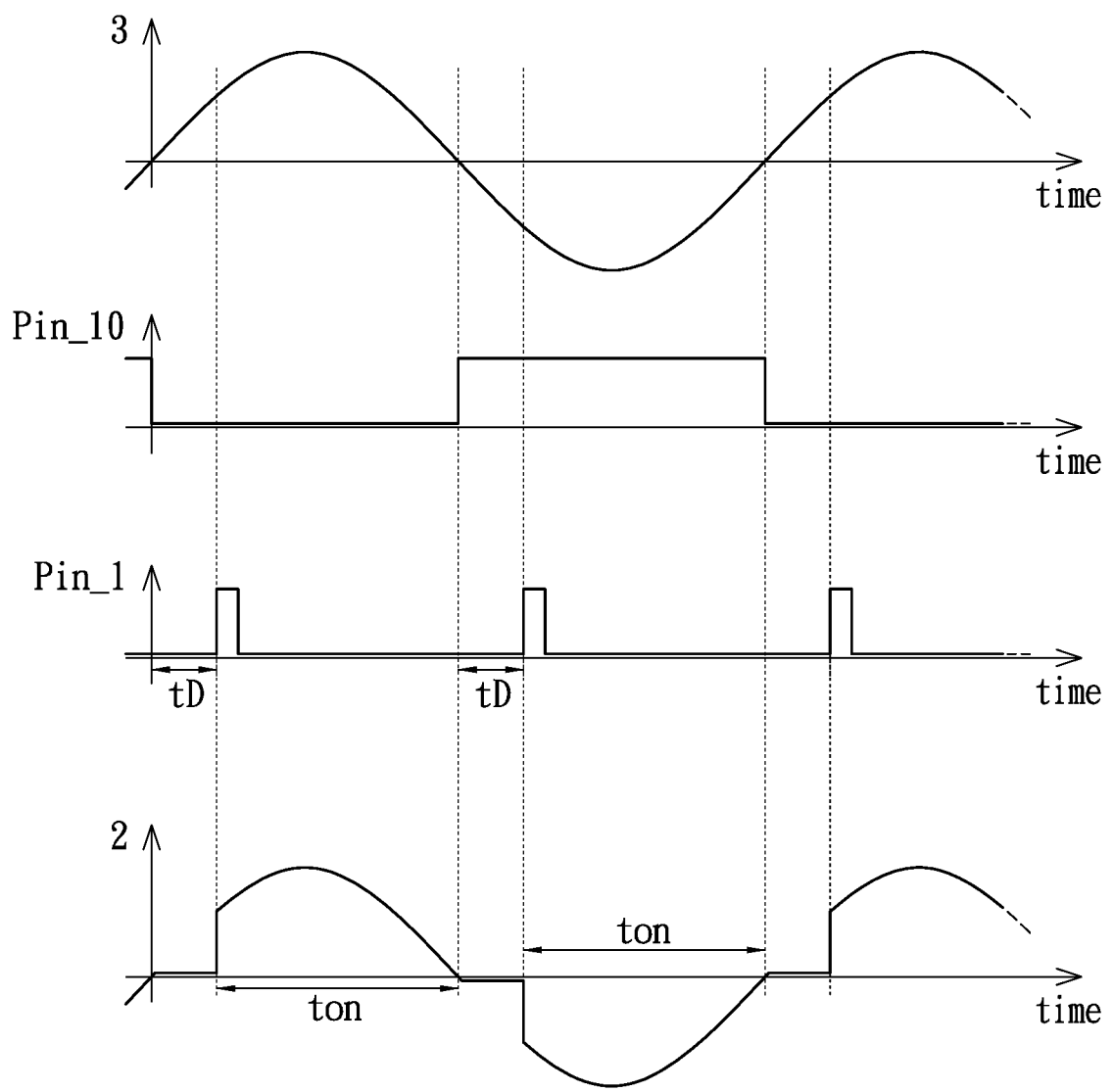
FIG. 6 is a voltage waveform diagram of a microcontroller based electronic switch when the electronic switch operating in the on/off switch control mode is in conduction state according to an exemplary embodiment of the present disclosure.
Figure 7:
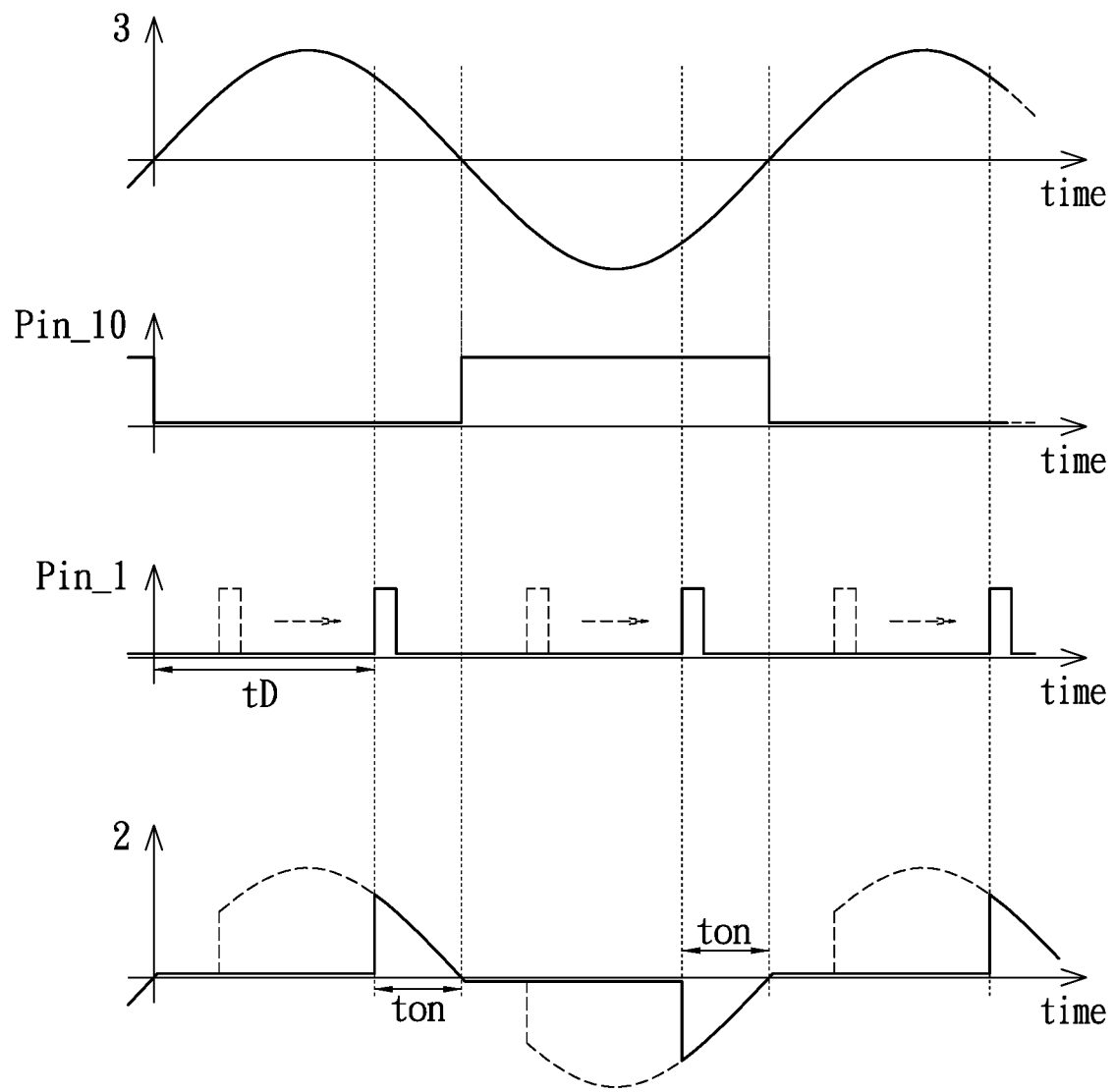
FIG. 7 is a voltage waveform diagram of a microcontroller based electronic switch operating in the dimming control mode according to an exemplary embodiment of the present disclosure.

Refer to FIG. 5, FIG. 6 and FIG. 7 in accompanying FIG. 2 and FIG. 4. According to an exemplary embodiment of the present disclosure, FIG. 5 is a voltage waveform diagram of a microcontroller based electronic switch in cut-off state when operating in on/off switch control mode, FIG. 6 is a voltage waveform diagram of a microcontroller based electronic switch in conduction state when operating in on/off switch control mode, and FIG. 7 is a voltage waveform diagram of a microcontroller based electronic switch when operating in dimming control mode. In FIG. 5, FIG. 6, and FIG. 7, the voltage waveforms as shown from the top are, respectively, a sine wave output from the AC power source 3, an output signal of the zero-crossing-point detector 13 that is fed to pin pin_10 of the microcontroller 12, an output signal from the pin pin_1 of the microcontroller 12, and a voltage waveform between the two ends of the load 2. The voltage waveforms are used to describe the interactions related to the program of the microcontroller 12 and the microcontroller based electronic switch 1 in the above mentioned two working modes. As already described above, the voltage signal generated by the zero-crossing-point detector 13 is a square wave with a low and a high voltage, which is fed to the pin pin_10 of the microcontroller 12 and, to be explained later, served as an external interrupt trigger signal. The voltage signal from the pin pin_1 of the microcontroller 12 is sent to the gate of the triac T1 to control the conduction state of the triac T1.

In the program loops corresponding to the on/off switch control mode and the dimming control mode, the microcontroller 12 utilizes the external interrupt control technique to generate voltage pulses synchronized with AC power. To accomplish it, the program of the microcontroller 12 has a setup with the voltage level variations at the pin pin_10 as external interrupt trigger signals. Since the time point of high or low voltage level variation in the signal generated by the zero-crossing-point detector 13 is the zero crossing point of AC sine wave, the external interrupt process is automatically triggered at the zero crossing point of the AC power source 3, and the related meaning of the details are further described in FIG. 6 and FIG. 7.

Referring to FIG. 5 in accompanying FIG. 2 and FIG. 4, the program of the microcontroller 12 starts from the loop of steps S1 and S2 of on/off switch control mode, wherein the microcontroller based electronic switch 1 is off. The program of the microcontroller 12 scans the voltage at the pin pin_3. If the voltage at the pin pin_3 is a high voltage, the microcontroller 12 generates a zero voltage at the pin pin_1, which is fed to the gate of the triac T1 to turn it off. For no current flowing through the triac T1, the voltage between the two ends of the load 2 is zero in each AC cycle.

Refer to FIG. 6 in accompanying FIG. 2 and FIG. 4. If the program of the microcontroller 12 detects a low voltage at the pin pin_3, the program of microcontroller 12 jumps to steps S3 and S4 of on/off switch control mode, wherein the microcontroller based electronic switch 1 is on. The microcontroller 12 scans within a few microseconds the voltage at the pin pin_10. The external interrupt happens in each AC half cycle (of some milliseconds) at the time point of voltage level variation in the square wave signal. In the external interrupt process, no other program is executed, instead the program is commanded to go back to the main program instantly. The program of the microcontroller 12 is designed based on the time point when the external interrupt occurs, which is also the zero crossing point of the AC power source 3. After a delay time tD with respected to the time point of the external interrupt, the program of the microcontroller 12 generates a zero-crossing-point time-delay pulse at the pin pin_1. The signal provided from the pin pin_1 is a zero-crossing-point time-delay pulse having a delay time tD after the zero crossing point of AC power. The zero-crossing-point time-delay pulse is generated both in the positive and negative half-cycle of the AC power source 3, and used to trigger in synchronization with AC power source 3 the triac T1 into conduction, such that the AC power source 3 delivers in each half AC cycle equal electric power to the load 2 which is in proportion to a conduction time ton of the triac T1. In contrast with the AC power source 3 and the zero crossing point delay pulse, the voltage waveform on the load 2 is depicted in FIG. 6, and the conduction time ton is designated.

In the loop of steps S3 and S4 of the microcontroller based electronic switch 1 being on, the delay time tD of the zero-crossing delay voltage pulse is a fixed value to make a constant average electric power delivered to the load 2. By designing a minimum time delay tD, the conduction time ton of the triac T1 can reach the maximum to make the maximum electric power transmission to the load 2. If the load 2 is an electric light source and the microcontroller based electronic switch 1 is alternatively switched in the conduction or cut-off state, the light source emits respectively the darkest or the brightest luminance. In practice, the load 2 can be an incandescent bulb, a fluorescent light, an AC LED diode or a light emitting diode module. If the load 2 is a light emitting diode module, the light-emitting diode module is connected between output ports of a full-wave rectification bridge.

Refer to FIG. 7 in accompanying FIG. 2 and FIG. 4. In the loop of steps S3 through S6, the microcontroller based electronic switch 1 is on, the program of the microcontroller 12 scans the voltage at the pin pin_3. If the sensing signal fed to the pin pin_3 is a low voltage with the time length Ts longer than nTo (n>2), the program of the microcontroller 12 jumps to the loop of steps S8 through S10 for executing the dimming control mode. When the microcontroller based electronic switch 1 is in the dimming control mode, the program of the microcontroller 12 scans the voltage at the pin pin_10, so as to generate a zero-crossing-point time-delay pulse with a delay time tD at the pin pin_1. Simultaneously, the program of the microcontroller 12 scans the voltage at the pin pin_3. If the detected sensing voltage at the pin pin_3 is a low voltage with different time length Ts, the program continuously increases the delay time tD of the zero-crossing-point time-delay pulse in proportion to the time length Ts. If the delay time tD reaches the maximum, the program of the microcontroller 12 responds no more to the detected low voltage at the pin pin_3. When the delay time tD is increased, the conduction time ton of triac T1 is decreased as shown in FIG. 7. The average electric power delivered to the load 2 is thus accordingly reduced. In FIG. 7, the voltage waveforms are depicted to show that the program of the microcontroller 12 shifts the delay time tD step by step corresponding to the low voltage sensing signal when the microcontroller based electronic switch 1 operates in the dimming control mode.

In practice, the load 2 can be a light-emitting diode, especially, AC-LED. The AC-LED has a cut-in voltage $V_t$ for conducting current. During a sinusoidal period of the AC power source 3, if the voltage magnitude of the AC power source is still lower than the cut-in voltage $V_t$ of the load 2 and when the pin pin_1 provides a zero-crossing-point time-delay pulse, the bi-directional controllable semiconductor switching element 14 cannot be triggered stably into conduction. Therefore, by designing the zero-crossing-point time-delay pulse as shown in FIG. 6 and FIG. 7, the cut-in voltage $V_t$ of the load 2 should be considered. Thus, to ensure that the bi-directional controllable semiconductor switching element 14 can be triggered stably, it is necessary to limit the delay time tD in an appropriate range as follows:

$$t_0 < tD < 1/(2f) - t_0,$$

wherein $t_0=(1/2\pi f)\sin^{-1}(V_t/V_m)$, f is the frequency and $V_m$ is the voltage amplitude of the AC power source 3. The knowledge for stable triggering provides mean for accurate design of the zero-crossing-point time-delay pulse that enables an efficient electric power transmission from the AC power source to the load 2 which may have specific impedance or threshold voltage.

Figure 8A:
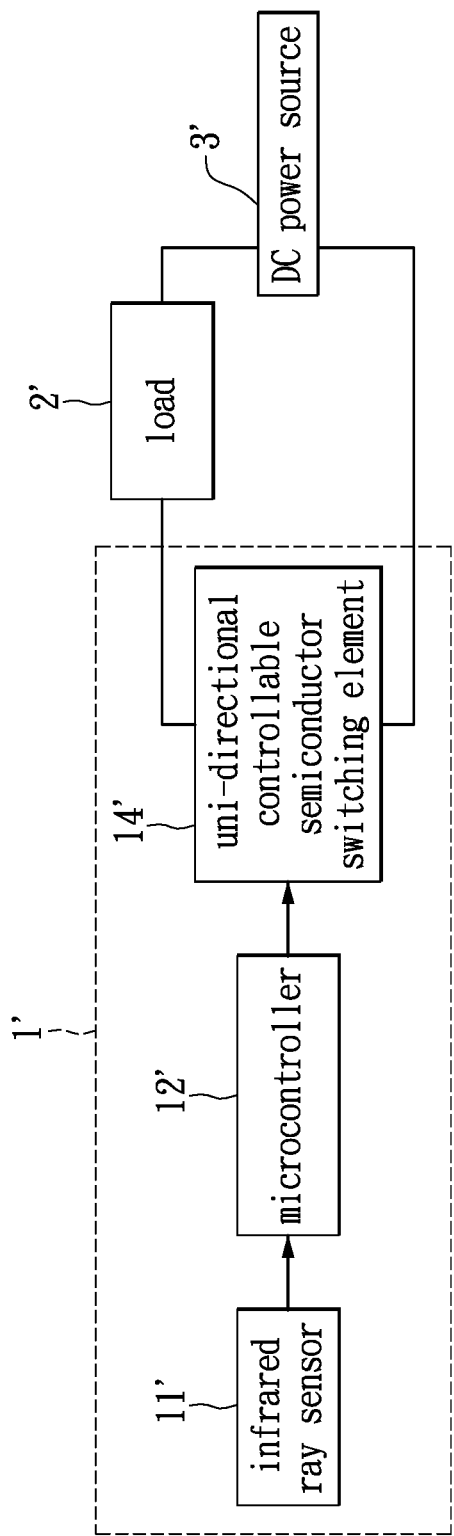
FIG. 8A is a block diagram of a microcontroller based electronic switch for a DC power source according to an exemplary embodiment of the present disclosure.

In addition, the concept of the present disclosure can also be applied to the DC power source, wherein the controllable semiconductor switching element and the program of the microcontroller 12 should be modified slightly, and the zero-crossing-point detector should be removed. Referring to FIG. 8A, FIG. 8A is a block diagram of a microcontroller based electronic switch 1' using an infrared ray sensor as a detection means for a DC power source according to an exemplary embodiment of the present disclosure. The microcontroller based electronic switch 1' is connected to a DC power source 3' and a load 2' in a serial fashion, so as to control the electric power of the DC power source 3' delivered to the load 2'. Compared to FIG. 1, the microcontroller based electronic switch 1' in FIG. 8A comprises an infrared ray sensor 11', a microcontroller 12', and a uni-directional controllable semiconductor switching element 14'. In practice, the uni-directional controllable semiconductor switching element 14' can be a bipolar junction transistor (BJT) or a metal-oxide-semiconductor field-effect transistor (MOSFET). The load 2' can be a light-emitting diode or an incandescent bulb, but present disclosure is not limited thereto.

Figure 8B:
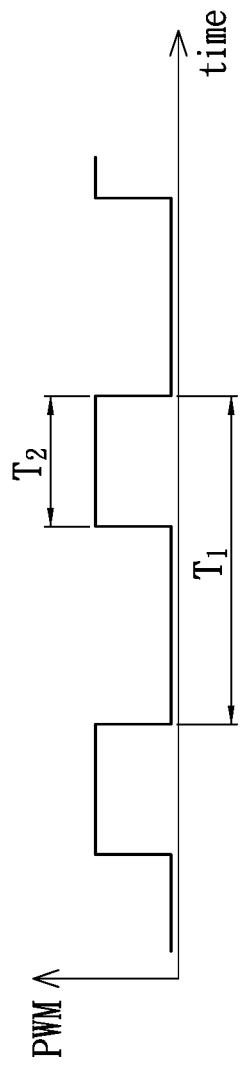
FIG. 8B is a voltage waveform diagram of the pulse width modulation voltage signal according to an exemplary embodiment of the present disclosure.

Referring to FIG. 3 and FIG. 8B, the infrared ray sensor 11' detects a user's hand, for instance, and converts the outcome into message carrying low voltage sensing signals readable to the microcontroller 12'. The microcontroller 12' decodes the low voltage sensing signal according to the program designed and written in its OTPROM, so as to make the microcontroller based electronic switch 1' operate in on/off switch control mode and dimming control mode accordingly. In the on/off switch control mode when the microcontroller based electronic switch 1' is off, the program of the microcontroller 12' generates a zero voltage fed to the gate of the uni-directional controllable semiconductor switching element 14' so as to turn off the switching element 14'. In the on/off switch control mode when the microcontroller based electronic switch 1' is on, the program of the microcontroller 12' generates PWM (pulse-width-modulation) signal fed to the gate of the uni-directional controllable semiconductor switching element 14' so as to turn on the switching element 14' such that a fixed electric power is transmitted from the DC power source 3' to the load 2'.

FIG. 8B is a voltage waveform diagram of the PWM signal according to an exemplary embodiment of the present disclosure. The PWM voltage signal is a square wave signal comprising a zero voltage (or low-voltage) and a high voltage, wherein the high voltage drives the uni-directional controllable semiconductor switching element 14' into conduction. If the time length of the high voltage is T2 and the period of the PWM voltage signal is T1, the average electric power delivered to the load 2' through the uni-directional controllable semiconductor switching element 14' is proportional to the ratio $T_2/T_1$, which is by definition the duty cycle of the PWM voltage signal and is denoted as $\delta=T_2/T_1$. In the on/off switch control mode, the program of the microcontroller 12' generates the PWM voltage signal with maximum duty cycle to make the microcontroller based electronic switch 1' deliver the maximum average electric power to the load 2'. In the dimming control mode, the program of the microcontroller 12' scans the low voltage sensing signal provided from the infrared ray sensor 11'. If the detected low voltage sensing signal has different time length Ts, the program of the microcontroller 12' decreases the duty cycle of the PWM voltage signal in proportion to each time length Ts, to gradually reduce the electric power sent to the load 2'.

In general, it is frequently to produce high-order harmonic interference when a bi-directional controllable semiconductor switching element works with conduction phase control technique to transmit AC electric power thereof. To eliminate harmonic interference, the concept of the present disclosure can also be applied to the case of AC power source without using triac element and zero-crossing-point detector.

Figure 9:
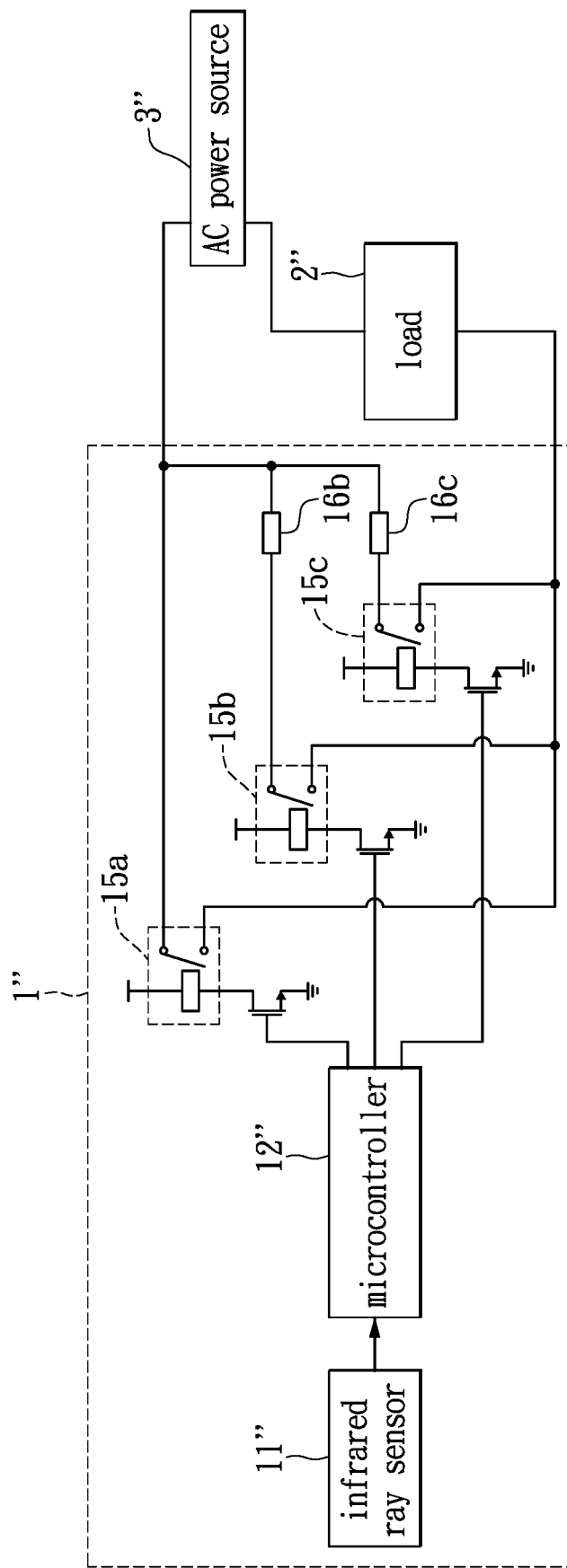
FIG. 9 is a block diagram of a microcontroller based electronic switch for AC power source according to another one exemplary embodiment of the present disclosure.

FIG. 9 is a block diagram of a microcontroller based electronic switch 1" using an infrared ray sensor as a detection means for AC power source according to another one exemplary embodiment of the present disclosure. The microcontroller based electronic switch 1" is connected to a load 2" and an AC power source 3" in the serial fashion. Compared to FIG. 1, the microcontroller based electronic switch 1" comprises an infrared ray sensor 11", a microcontroller 12", and three relays 15a, 15b, and 15c connected to different types of electrical impedances, for example, capacitors, respectively. Thus, the three relays 15a, 15b, and 15c together with impedance elements 16b and 16c form three different conducting paths with the different impedances. The three relays 15a, 15b, and 15c are arranged parallel to each other, and all of them are connected to the load 2" and the AC power source 3". In other words, each of the three relays 15a, 15b, and 15c is connected to the load 2" and the AC power source 3" in the serial fashion. In practice, the load 2" can be an electric fan, an AC-LED or an incandescent bulb.

The microcontroller 12" has its three pins respectively connected to the gates of MOSFET (metal-oxide-semiconductor field-effect transistor), which drive respectively the three relays 15a, 15b, and 15c. When the three pins of the microcontroller 12" simultaneously provide zero voltage to the three MOSFETs, the three relays 15a, 15b, and 15c are cut-off, and the microcontroller based electronic switch 1" is cut-off or opened. When one pin of the microcontroller 12" generates a high voltage fed to one MOSFET, and the other two pins are zero voltage, merely one corresponding relay is in conduction state and the other two relays are cutoff. Accordingly, when the first relay 15a is in conduction state, a first-level electric power is transmitted directly from the AC power source 3" to the load 2"; when the second relay 15b is in conduction state, a second-level electric power is transmitted through the impedance 16b to the load 2"; when the third relay 15c is in conduction state, a third-level electric power is transmitted through the impedance 16c to the load 2".

Referring to FIG. 3 and FIG. 9, the infrared ray sensor 11' detects a user's hand, for instance, and converts the outcome into a low voltage sensing signal readable to the microcontroller 12". The program of the microcontroller 12" controls the microcontroller based electronic switch 1" to operate in on/off switch control mode and in dimming control mode according to the detected infrared ray signal. In the on/off switch control mode, when the microcontroller based electronic switch 1" is off, all three pins of the microcontroller 12" respectively generates zero voltage fed to the three gates of MOSFETs so as to turn off all relays 15a~15c. In the on/off switch control mode, when the microcontroller based electronic switch 1" is on, the microcontroller 12" generates a high voltage from one pin, and zero voltage from the other two pins, that only the first relay 15a is in conduction state so as to deliver the first-level AC power to the load 2". In dimming control mode, the program of the microcontroller 12" scans the low voltage sensing signal provided by the infrared ray sensor 11'. When according to the low voltage sensing signal, the program of the microcontroller 12' generates a high voltage from the second or the third pin and sets the other two pins at zero voltage, then one of the relays 15b and 15c is activated to be in conduction state, so that an AC electric power of the second-level or the third-level is transmitted to the load 2". In other words, the microcontroller 12 generates zero voltage or high voltage, respectively, to control the three relays 15a, 15b, and 15c to be opened or shorted in response to infrared ray sensing signal.

Although the above description of the exemplary embodiments takes infrared ray sensor as a means for detecting user's motion and generating sensing signal, the technology of the present disclosure has no restriction on the types of detection method used. There are quite a few detection methods including touch or touchless means that can be applied to the present invention of the multifunctional electronic switch such as an infrared ray sensor (touchless interface), an electrostatic induction sensor (also touchless interface), or a push button sensor (direct touch interface). Each detection method may require different motion control signals to be played by the user but the core technology remains using the time length and format of the binary sensing signals as the message carrier for transmitting the user's choice of working mode. The microcontroller thereby decodes or interprets the received message carrying sensing signals according to the software program written in the OTPROM, recognizes the working mode selected by the user and activates the corresponding loop of subroutine for performance execution.

Similar to the infrared ray sensor, the electrostatic induction sensor can also create a touchless interface. The electrostatic induction sensor generally comprises a copper sheet sensing unit with adequately design shape and packaged with non-conductive material. Such copper sheet sensing unit is further electrically connected to a signal generating circuit similar to the infrared detection sensor unit. The copper sensing unit serves as an anode pole and the human body (normally refers to finger or hand) serves as a cathode pole to form a configuration of a capacitor. When the user's hand is approaching the copper sensing unit, the electric charges are being gradually induced and built up on the surface of the copper sensing unit with increasing density. Consequently, the copper sensing unit changes its electric state from zero voltage state to a low voltage state. Such low voltage level will continue to grow as the user's hand moving closer and closer to the copper sensing unit till reaching a designed threshold point which will trigger the detection circuit to generate a low voltage sensing signal. The distance between the copper sensing unit and the space point where the threshold voltage incurs is defined as the effective detecting zone. Similarly but reversely when the user's hand is moving out from an operative point of the detecting zone of the copper sensing unit, the voltage level will continue to decline till passing the designed threshold point which will trigger the cutoff of the low voltage sensing signal. The time length of the low voltage sensing signal so generated or in other words the time period between moving in and moving out the effective detecting zone can be designed to represent the selection of different working modes. If the time length is shorter than a preset time interval, it means the user's selection is to perform the on/off switch control mode; if the time length is longer than a preset time interval, it means the user's selection is to perform the diming or power level control mode; if two or more low voltage sensing signals are consecutively generated within a preset time interval, in other words the user's hand moving in and out the detecting zone twice or swing across the detecting zone back and forth, it means the user's selection is to perform the delay timer management mode.

For direct touch detection sensors, such as a touch sensor or a push button detection sensor, one touch on the conductive base or one instant press on the control button within a preset time interval will trigger the generation of a single sensing signal which will cause the microcontroller to execute the subroutine of the on/off switch control mode; a long touch on a conductive base or a long press on a control button longer than the preset time interval will trigger the generation of a single sensing signal with time length longer than the preset time interval and the microcontroller responsively will execute the subprogram of dimming control or power level control mode. Double instant touches on the conductive base or double instant press on the control button within a preset time interval will trigger the generation of two consecutive sensing signals which will cause the microcontroller to execute the subroutine of delay timer management mode.

Figure 10A:
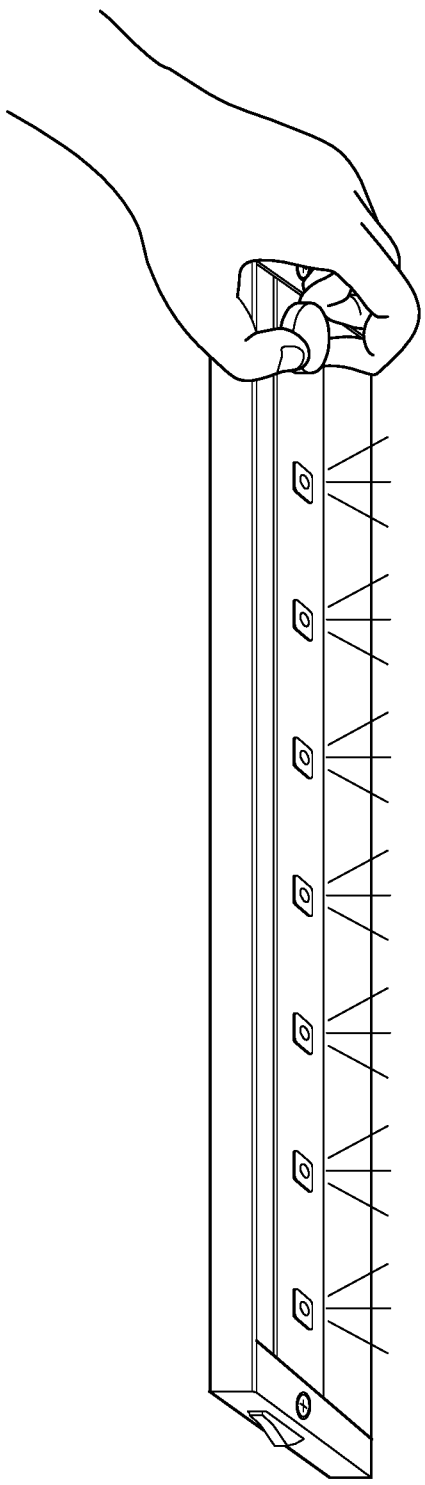
FIG. 10A is an application diagram of a traditional popular piece of under cabinet light with LED as light source.
Figure 10B:
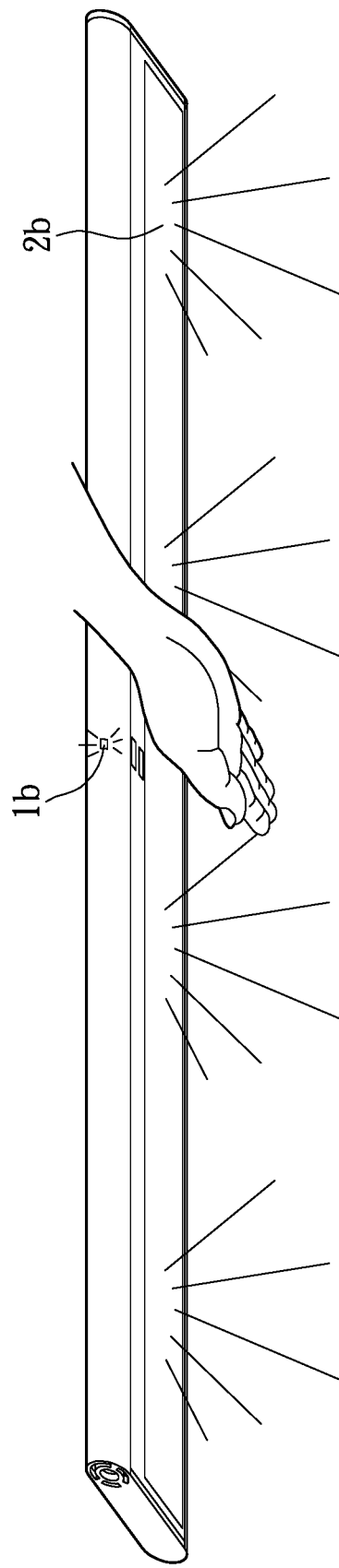
FIG. 10B is an application diagram of an exemplary embodiment of the present disclosure for a LED under cabinet light featured with a touchless interface between the user and the under cabinet light.

FIG. 10A and FIG. 10B together provide a good show case to prove the value of the user friendly concept of the present invention. Picture shown in FIG. 10A is a popular piece of under cabinet light with LED as light source. A manual on/off control switch is built on the right hand side of the rectangular housing and a dimming knob is built on the front panel facing downward. Under cabinet lights are always installed underneath the kitchen cabinets to provide sufficient indirect illumination to the user to do the kitchen work. The under cabinet lights and the kitchen cabinet are always installed at approximately the breast level of the users for the convenience of doing kitchen work so that the users can comfortably do the kitchen work without bending their body and having to work in a glaring environments. The current market piece as shown in FIG. 10A is not an user friendly device; the user has to either use his or her hand to blindly search the locations of the on/off switch and the dimming knob or to bend his or her body to find the exact locations of the two control units for operation. Additionally, the direct touch to control the on/off switch and dimmer also brings up concerns of contagion and contamination in preparing food in kitchen area and the housewives may have to wash their hands more frequently than necessary.

FIG. 10B is an application of the present invention for a LED under cabinet light featured with a touchless interface between the user and the under cabinet light. A motion of single swing of user's hand across the detecting zone of the microcontroller based electronic switch 1b will activate the on/off switch mode alternately turning on and turning off the under cabinet light 2b. A motion of placing user's hand in the detecting zone exceeding a preset time interval will activate the diming mode to allow selection of brightness or power level. And a motion of double swings of user's hand across the detecting zone within a preset time interval will activate the delay timer management mode to provide the user with a transitional illumination to leave the kitchen area before the light is completely turned off. The three basic working modes can be easily managed with simple motions played by the user without the hassles of having to blindly search the control switch and dimming knob, or to bend body to find the location of the control elements or to frequently wash hands to avoid concerns of contagion and contamination in preparing food. This is truly a very user friendly exemplary embodiment of the present disclosure compared with what are currently being sold in the market as shown in FIG. 10A.

Figure 10C:
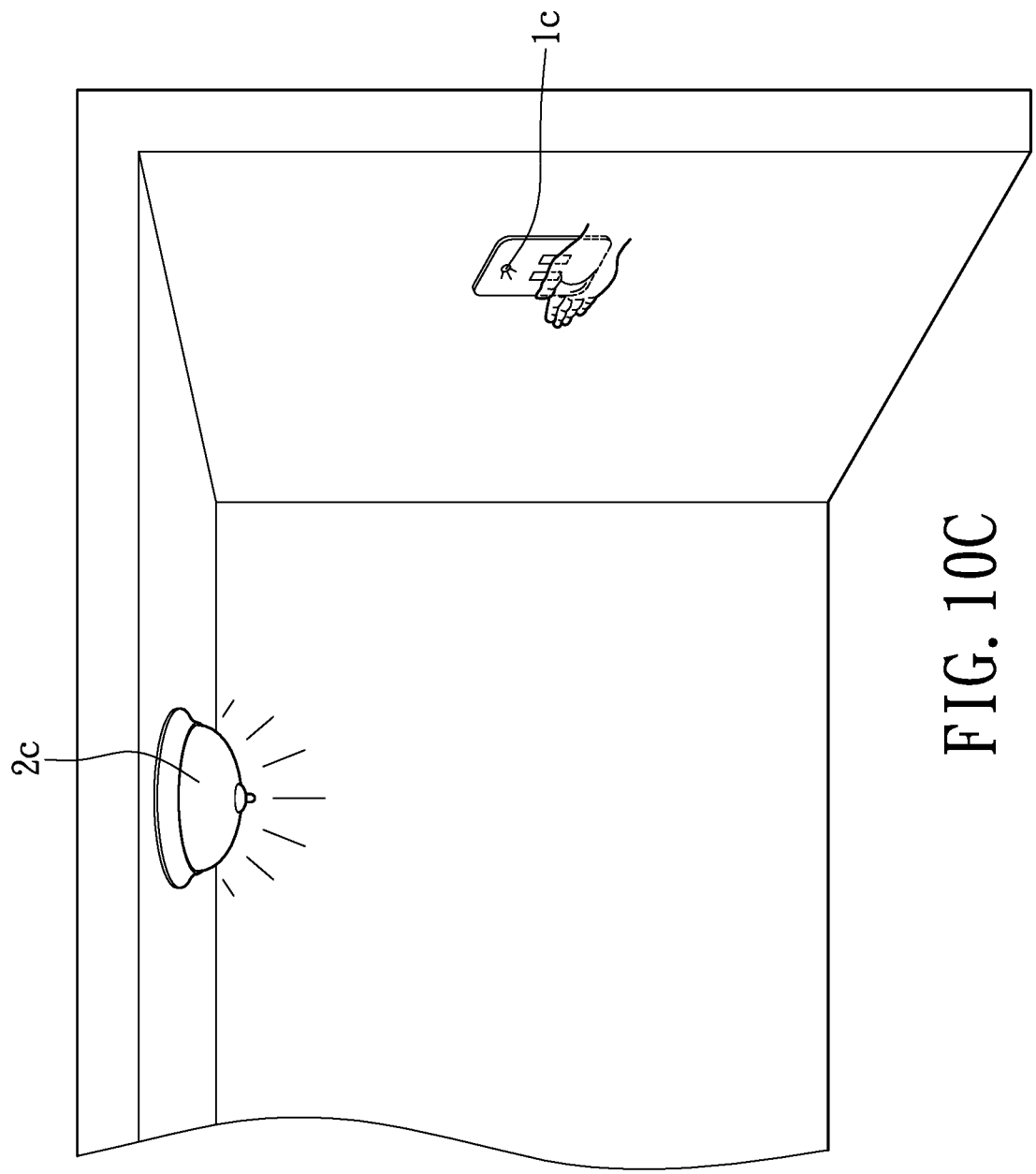
FIG. 10C is an application diagram of an exemplary embodiment of the present disclosure for a wall switch construction electrically connected to a ceiling light for the performance of three working modes.
Figure 11A:
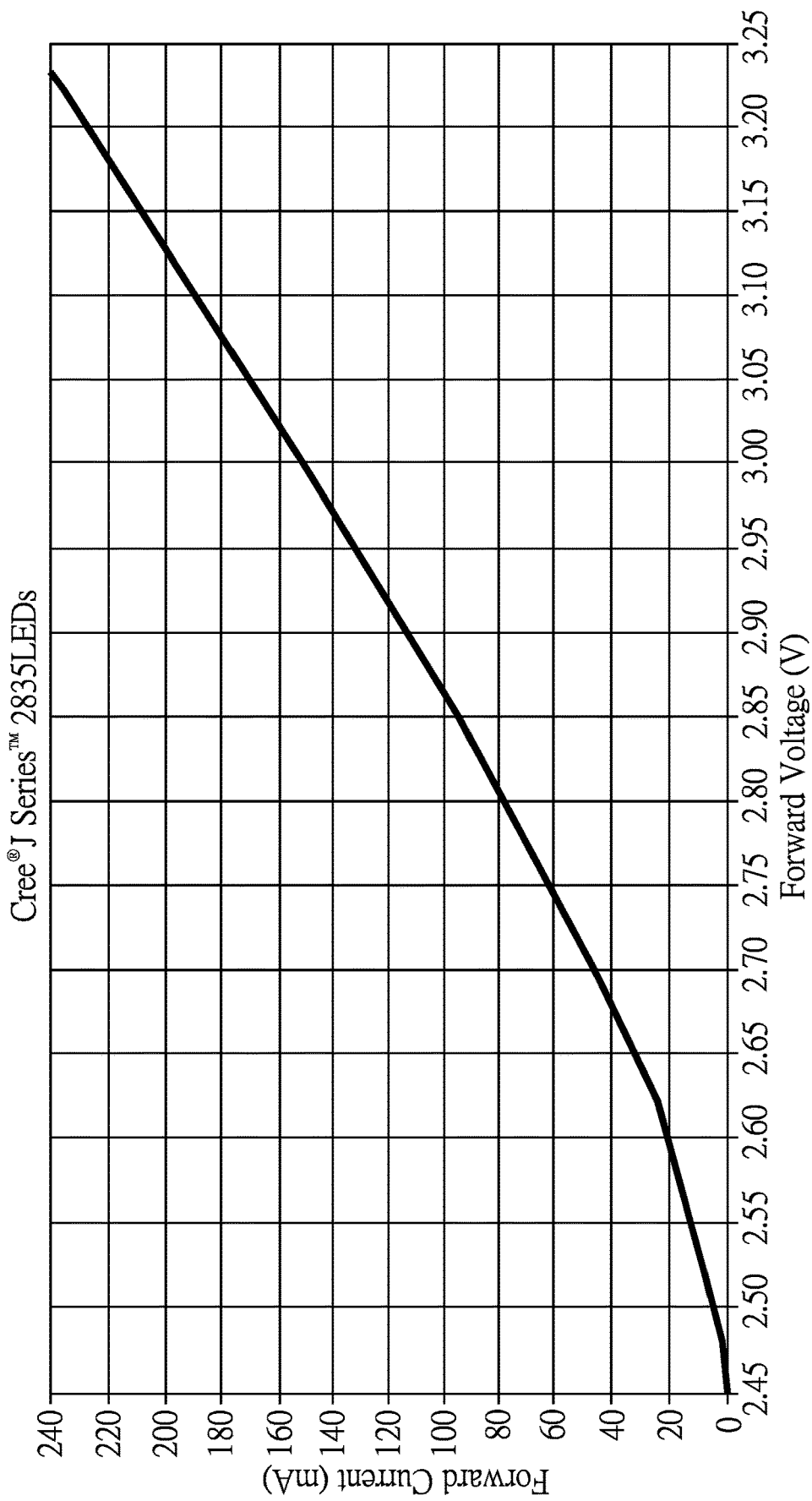
FIGS. 11A, 11B, 11C and 11D schematically and respectively show V-I relationship charts (Forward Current vs. Forward Voltage) for a white LED chip from each of 4 different LED manufacturers.
Figure 11B:
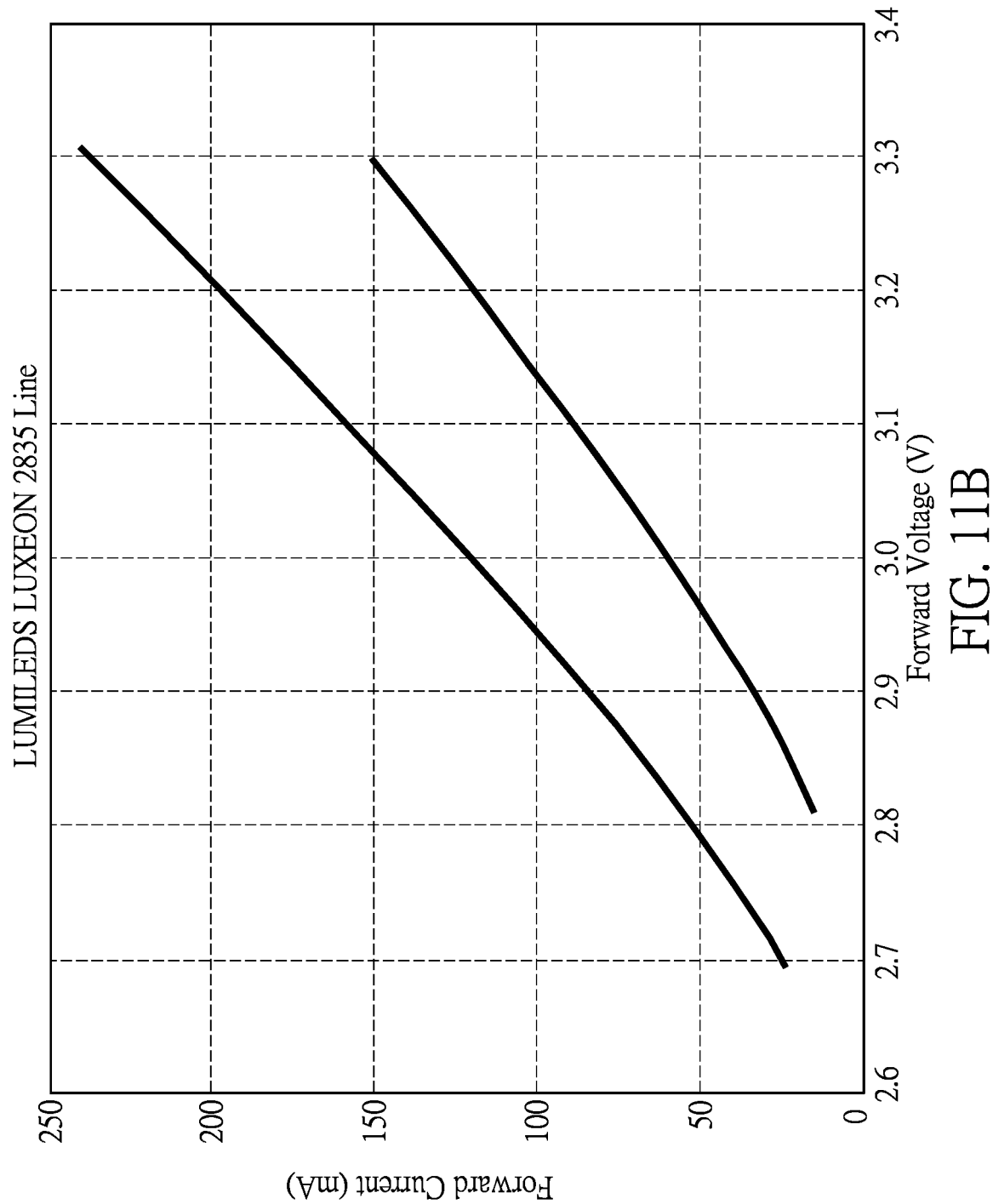
Figure 11C:
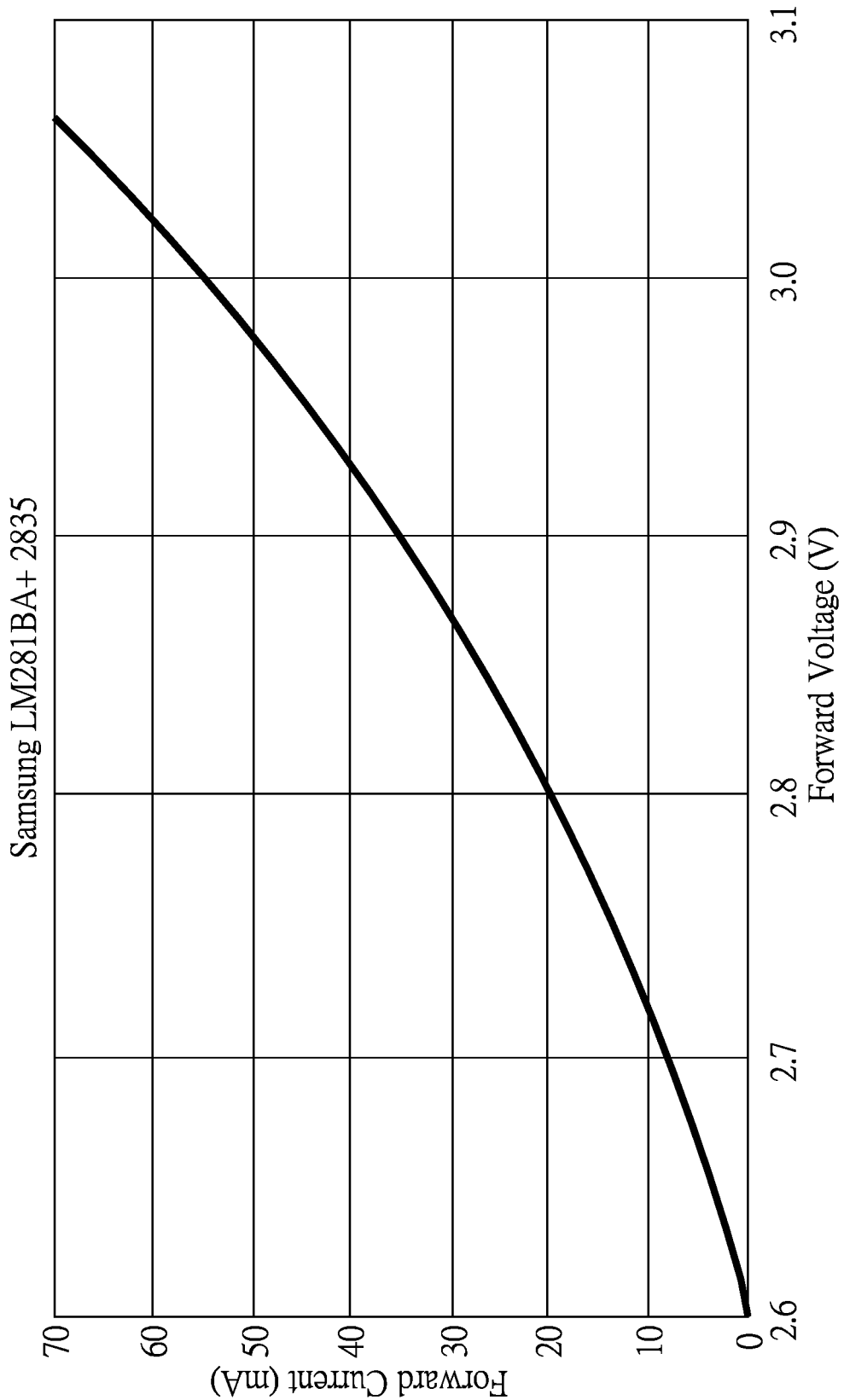
Figure 11D:
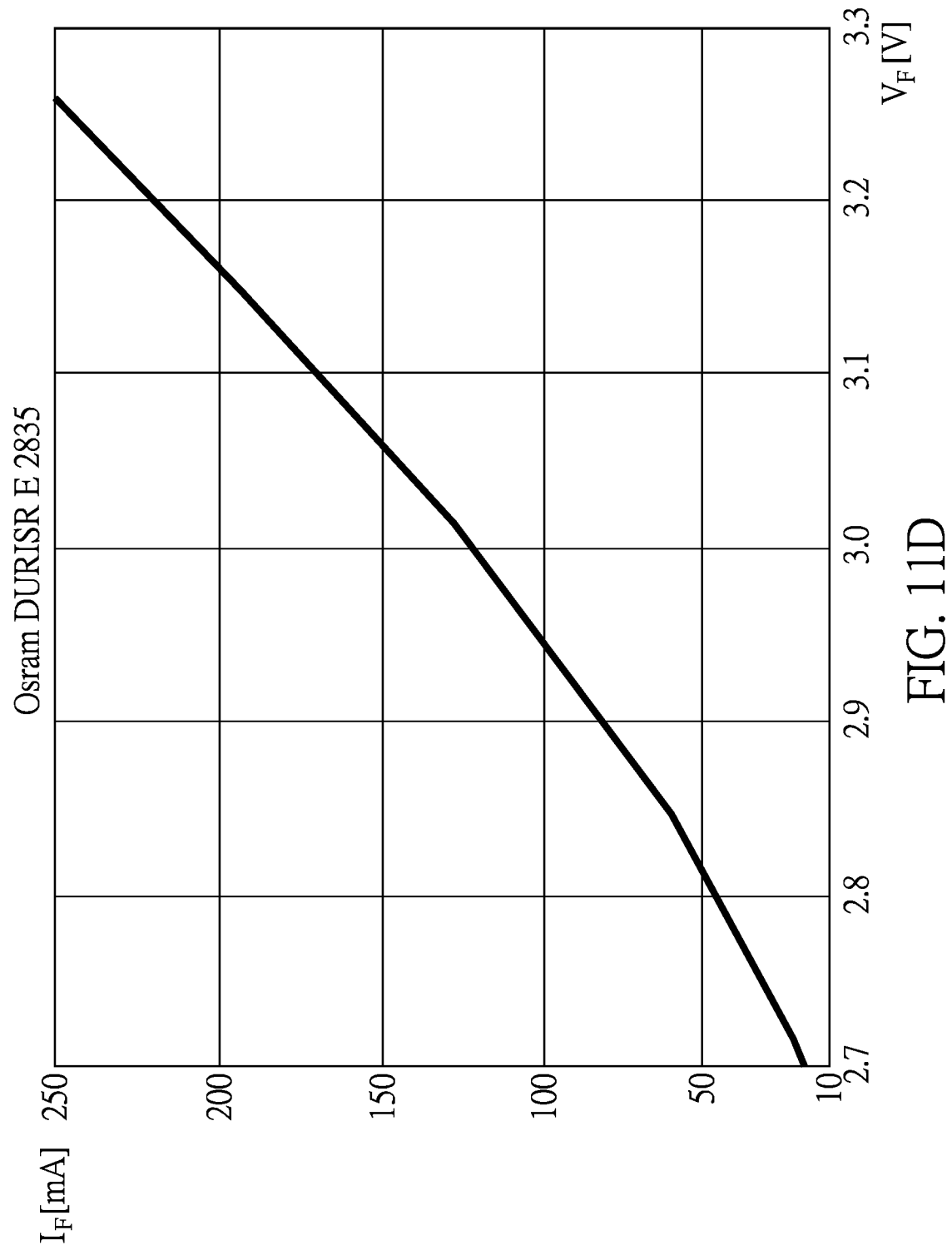

FIG. 10C is another application of the present invention for a wall switch construction electrically connected to a ceiling light for the performance of three working modes. A motion of single swing across the detecting zone in front of the wall switch 1c by user's hand within a preset time interval will activate the on/off switch mode alternately turning on and turning off the ceiling light 2c. A motion of placing user's hand in front of the wall switch 1c and stay in the detecting zone for a time period longer than a preset time interval will activate the dimming mode to allow the user to select the desired brightness. And a motion of double swings across the detecting zone within a preset time interval will activate the performance of the delay timer management mode to provide the user a transitional illumination to leave for the next location before the ceiling light is completely turned off. This new wall switch when compared with conventional switch represents a very user friendly innovation from the easy operation point of view. Additionally, the delay timer mode helps to relieve the inconvenience of either having to live with a dark environment after turning off the light or using a three way switch system to provide transitional illumination. The conventional touch based wall switch is also a virus gathering spot because of use by many users and the issue of contagion and contamination is always a valid concern even outside the surgical space.

When the light source of the lighting load 2 is confined to the use of an LED load, the compliance and satisfaction of a voltage operating constraint attributable to the unique electrical characteristics of the LED load is "critical" to a successful performance of an LED lighting device. Any LED lighting device failing to comply with the voltage operating constraint attributable to the unique electrical characteristics of an LED load is bound to become an useless art. This is because the LED as a kind of solid state light source has very different electrical characteristics for performing light emission compared with conventional light source such as incandescent bulbs or fluorescent bulbs. For instance, for a white light or blue light LED there exists a very narrow voltage domain ranging from a minimum threshold voltage at 2.5 volts to a maximum working voltage at 3.3 volts, in order to successfully operate the LED; in other words, when a forward voltage imposed on the LED is lower than the minimum threshold voltage, the LED is not conducted and therefore no light is emitted, when the forward voltage exceeds the maximum working voltage, the heat generated by a forward current could start damaging the construction of the LED. Therefore, the forward voltage imposed on the LED is required to operate between the minimum threshold voltage and the maximum working voltage. In respect to the LED load of the lighting load 2 the cut-in voltage $V_t$ of ACLEDs is technically also referred to as a minimum threshold voltage attributable to PN junction semiconductor structure manufactured in LEDs. More specifically, the LED is made with a PN junction semiconductor structure "inherently" featured with three unique electrical characteristics, the first characteristic is one-way electric conduction through the PN junction fabricated in the LED, the second electrical characteristic is a threshold voltage $V_{th}$ required to trigger the LED to start emitting light and the third electrical characteristic is a maximum working voltage $V_{max}$ allowed to impose on the LED to avoid a thermal runaway to damage or burn out the semiconductor construction of the LED. The described cut-in voltage $V_t$ has the same meaning as the above mentioned threshold voltage $V_{th}$ which is a more general term to be used for describing the second electrical characteristic of a PN junction semiconductor structure. Also because the cut-in voltage $V_t$ is specifically tied to forming a formula to transform the threshold voltage into a corresponding time phase of AC power for lighting control, it is necessary to use the term $V_{th}$ as a neutral word for describing the LED electrical characteristics to avoid being confused with the specific application for ACLED alone. Additionally, it is to be clarified that the term $V_m$ is related to the amplitude of the instant maximum voltage of an AC power source which has nothing to do with the third electrical characteristic Vmax of an LED load.

An LED chip is a small piece of semiconductor material with at least one LED manufactured inside the semiconductor material. A plurality of LEDs may be manufactured and packaged inside an LED chip for different levels of wattage specification in order to meet different illumination need. For each LED chip designed with a different level of wattage specification there always exists a narrow voltage domain $V_{th} < V < V_{max}$, wherein $V_{th}$ is the threshold voltage to enable the LED chip to start emitting light and $V_{max}$ is the maximum working voltage allowed to impose on the LED chip to protect the LED chip from being damaged or burned out by the heat generated by a higher working voltage exceeding $V_{max}$.

For an LED load configured with a plurality of the LED chips in any LED lighting device, regardless such LED load being configured with ACLED chips or DC LED chips, the working voltage of each single LED chip is required to operate in a domain between a threshold voltage $V_{th}$ and a maximum working voltage $V_{max}$ or $V_{th} < V < V_{max}$ and the working voltage of the LED load comprising N pieces of LED chips connected in series is therefore required to operate in a domain established by a threshold voltage $N \times V_{th}$ and a maximum working voltage $N \times V_{max}$ or $N \times V_{th} < V < N \times V_{max}$, wherein N is the number of the LED chips electrically connected in series. For any LED lighting device comprising an LED load it is required that the LED load in conjunction with an adequate level of power source is configured with a combination of in series and in parallel connections of LED chips such that the electric current passing through each LED chip of the LED load remains at an adequate level such that a voltage V across each LED chip complies with an operating constraint of $V_{th} < V < V_{max}$ featuring electrical characteristics of the LED chip or a voltage V across the LED load configured with N number of LED chips connected in series complies with an operating constraint of $N \times V_{th} < V < N \times V_{max}$. Such narrow operating range therefore posts an engineering challenge for a circuit designer to successfully design an adequate level of power source and a reliable circuitry configured with an adequate combination of in series connection and in parallel connection of LED chips for operating a higher power LED security light.

FIGS. 11A, 11B, 11C and 11D comprise 4 drawings schematically and respectively showing a V-I relationship chart (Forward Current vs. Forward Voltage) for a white light LED chip from each of 4 different LED manufacturers; as can be seen from the chart when a forward voltage V is below a minimum forward voltage at around 2.5 volts, the LED chip is not conducted so the current I is zero, as the forward voltage exceeds 2.5 volts the LED chip is activated to generate a current flow to emit light, as the forward voltage continues to increase, the current I increases. exponentially at a much faster pace, at a maximum forward voltage around 3.3 volts the current I becomes 250 mA which generates a heat that could start damaging the PN junction of the LED chip. The minimum forward voltage (the threshold voltage or cut-in voltage) and the maximum forward voltage are readily available in the specification sheets at each of LED manufacturers, such as Cree, Lumileds, Samsung, Osram, and etc. Different LED manufacturers may have slightly different figures due to manufacturing process but the deviations of differences are negligible. The constraints of minimum forward voltage and maximum forward voltage represent physical properties inherent in any solid state light source. They are necessary matter for configuring any LED lighting products to ensure a normal performance of an LED load.

FIG. 12 is a data sheet showing data of the minimum forward voltages and maximum forward voltages collected from various LED manufacturers. They are fundamental requirements for configuring any LED lighting control devices to ensure a successful performance of any LED lighting device.

In summary, the compliance of voltage operating constraint $V_{th}<V<V_{max}$ featuring electrical characteristics of an LED chip is a critical technology for ensuring a normal performance of the LED load. Failing to comply with such voltage operating constraint can quickly age or seriously damage the semiconductor structure of the LED chip with a consequence of quick lumens depreciation of the LED bulbs and the product lifetime being substantially shortened, which will be unacceptable to the consumers.

The compliance of the operating constraint $V_{th}<V<V_{max}$ is a necessary matter for any LED lighting device though it is not an obvious matter as it requires complicated technologies to calculate and coordinate among an adequate level of power source, a control circuitry and a non-linear light emitting load. For conventional lighting load such as incandescent bulb there exists no such operating constraint. This is why in the past years there had been many consumers complaining about malfunction of LED bulbs that the consumers were frustrated with the fast depreciation of lumens output and substantially shortened product lifetime of the LED bulbs purchased and used. A good example was a law suit case filed by the Federal Trade Commission on Sep. 7, 2010 (Case No. SACV10-01333 JVS) for a complaint against a leading lighting manufacturer for making deceptive LED lamps and making false claims with respect to the life time of their LED lamps and a huge amount of monetary relief was claimed with the Court in the complaint.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A microcontroller based electronic switch, comprising:
   a controllable switching circuitry, electrically connected between an LED load including a plurality of LEDs and a power source for controlling and delivering a DC power to said LED load;
   at least one detection device, for detecting at least one external control signal and convert said at least one external control signal into at least one message carrying sensing signal with at least one signal format; and
   a microcontroller designed to receive and interpret said at least one message sensing signal generated by said at least one detection device;
   wherein said at least one detection device is electrically coupled with said microcontroller;
   wherein said controllable switching circuitry is electrically coupled with said microcontroller, wherein said microcontroller outputs a control signal to control a conduction state or a cutoff state of said controllable switching circuitry according to said at least one message carrying sensing signal generated by said at least one detection device;
   wherein when said controllable switching circuitry is in said conduction state, said microcontroller further controls an electric power transmission level from said power source to said LED load according to said at least one signal format of said at least one message carrying sensing signal received from said at least one detection device;
   wherein said at least one signal format of said at least one message carrying sensing signal is a short voltage signal, a long voltage signal, a constant voltage signal, a plurality of said short voltage signals, a plurality of said long voltage signals or a combination of said short voltage signal and said long voltage signal; wherein said short voltage signal and said long voltage signal are defined by a signal time length of a voltage signal generated by said detection device; wherein when said signal time length of said voltage signal is equal to or shorter than a preset time interval, said voltage signal is said short voltage signal, wherein when said signal time length of said voltage signal is longer than said preset time interval, said voltage signal is said long voltage signal, or by said signal time length of a series of pulse signals consecutively generated;
   wherein when said microcontroller receives said at least one message carrying sensing signal, said microcontroller operates to activate a corresponding process according to said at least one signal format of said at least one message carrying sensing signal to perform at least one of illumination performance control modes including at least an on/off switch control mode, a dimming control mode, an illumination level switching control mode and a delay shutoff control mode;
   wherein said LED load connected to said microcontroller based electronic switch is confined to a configuration that said plurality of LEDs of said LED load are managed with an adequate in series and/or in parallel connections such that when incorporated with an adequate level setting of said DC power, an electric current passing through each LED of said LED load remains at a safety level such that a voltage V across each LED complies with an operating constraint of $V_{th}<V<V_{max}$ featuring electrical characteristics of each LED, wherein $V_{th}$ is a minimum threshold voltage required to trigger each LED to start emitting light and $V_{max}$ is a maximum operating voltage across each LED to avoid a thermal damage or burning out of LED construction;
   wherein when said LED load is configured with a plurality of N number LEDs or N sets of parallel connected LEDs electrically connected in series, a working voltage $V_N$ across said LED load is confined in a domain between a minimum voltage equal to the sum of said threshold voltages of all LEDs or sets of parallel connected LEDs electrically connected in series and a maximum voltage equal to the sum of said maximum operating voltages of all LEDs or sets of parallel connected LEDs electrically connected in series, identically expressed as $N \times V_{th} < V_N < N \times V_{max}$; and wherein said microcontroller is a programmable integrated circuit device or an application specific integrated circuit for generating said control signal.

2. The microcontroller based electronic switch according to claim 1, wherein said detection device is configured with a touchless interface for detecting said external control signal and converting said external control signal into said at least one message carrying sensing signal interpretable to said microcontroller.

3. The microcontroller based electronic switch according to claim 2, wherein said touchless interface is an active infrared ray motion sensor comprising a transmitter to emit infrared light into an area to form a defined detection zone and a receiver to detect said infrared light reflected from an object entering, staying in and leaving said defined detection zone, wherein when an object enters and leaves said defined detection zone, a circuitry responsively generates a first voltage sensing signal with a time length corresponding to a time duration of said object entering and staying in said defined detection zone; wherein when said object leaves said defined detection zone, said circuitry delivers a second voltage signal, said first voltage sensing signal with said time length is said at least one message carrying sensing signal to be delivered to said microcontroller for performing said at least one of illumination performance control modes including at least said on/off switch control mode, said dimming control mode, said illumination level switching control mode and a said delay shutoff control mode.

4. The microcontroller based electronic switch according to claim 2, wherein said touchless interface is a passive infrared ray motion sensor electrically coupled to said microcontroller for detecting a motion signal generated by an intruder into said at least one message carrying sensing signal with said at least one signal format interpretable to said microcontroller for performing said at least one of illumination performance control modes including at least said on/off switch control mode, said dimming control mode, said illumination level switching control mode and said delay shutoff control mode.

5. The microcontroller based electronic switch according to claim 2, wherein said touchless interface is an ultrasonic wave motion sensor comprising a transmitter to transmit ultrasonic wave into an area to form a detection zone and a receiver to detect the ultrasonic wave reflected from an intruder entering said detection zone for detecting a motion signal and converting said motion signal into said at least one message sensing signal with said at least one signal format interpretable to said microcontroller for performing said at least one of illumination performance control modes including at least said on/off switch control mode, said dimming control mode, said illumination level switching control mode and said delay shutoff control mode.

6. The microcontroller based electronic switch according to claim 2, wherein said touchless interface is a microwave motion sensor electrically coupled with said microcontroller, comprising a transmitter to transmit microwave signal into an area to form a detection zone and a receiver to detect said microwave signal reflected from an intruder entering said detection zone for detecting a motion signal and converting said motion signal into said at least one message sensing signal with said at least one signal format interpretable to said microcontroller for performing said at least one of illumination performance control modes including at least said on/off switch control mode, said dimming control mode, said illumination level switching control mode and said delay shutoff control mode.

7. The microcontroller based electronic switch according to claim 2, wherein said touchless interface is a wireless remote control device electrically coupled to said microcontroller to receive and convert a wireless external control signal into said at least one message carrying sensing signal with said at least one signal format interpretable to said microcontroller for performing said at least one of illumination performance control modes including at least said on/off switch control mode, said dimming control mode, said illumination level switching control mode and said delay shutoff control mode.

8. The microcontroller based electronic switch according to claim 7, wherein said wireless remote control device is a Wi-Fi wireless signal receiver, a Blue Tooth wireless signal receiver, a microwave wireless signal receiver or a millimeter wave wireless signal receiver.

9. The microcontroller based electronic switch according to claim 1, wherein a wireless signal transmitter is further electrically coupled with said microcontroller to convert said at least one message carrying sensing signal into at least one wireless control signal to synchronously control at least one lighting performance of at least one neighboring lighting apparatus.

10. The microcontroller based electronic switch according to claim 9, wherein said wireless signal transmitter is a Wi-Fi wireless signal transmitter, a Blue Tooth wireless signal transmitter, a microwave wireless signal transmitter or a millimeter wave wireless signal transmitter.

11. A lighting apparatus, comprising:
a light emitting unit configured with an LED load including a plurality of LEDs;
a loading and power control unit comprising a microcontroller and a controllable switching circuitry;
at least one detection device, for detecting at least one external control signal and converting said at least one external control signal into at least one message carrying sensing signal with at least one signal format interpretable to said microcontroller for performing at least one illumination performance of said light emitting unit; and
a wireless signal transmitter to convert said at least one message carrying sensing signal into at least one wireless control signal to activate at least one neighboring lighting apparatus for remotely and synchronously performing said at least one illumination performance;
wherein said controllable switching circuitry electrically connected between said LED load and a power source comprises at least one semiconductor switching element for controlling and delivering a DC power from said power source to said LED load, wherein said microcontroller is electrically coupled with said at least one semiconductor switching element, said at least one detection device and said wireless signal transmitter;
wherein said microcontroller outputs a control signal to control a conduction state or a cutoff state of said at least one semiconductor switching element according to said at least one signal format of said at least one message carrying sensing signal received from said at least one detection device;
wherein when said at least one semiconductor switching element is in said conduction state, said microcontroller further adjust said control signal to control a conduction rate of said at least one semiconductor switching element to set an electric power transmission level from said power source to said LED load according to said at least one signal format of said at least one message carrying sensing signal received from said at least one detection device;

wherein said at least one signal format of said at least one message carrying sensing signal is a short voltage signal with a signal time length equal to or shorter than a preset time interval, a long voltage signal with a signal time length longer than said preset time interval, a constant voltage signal with a voltage value, a plurality of said short voltage signals, a plurality of said long voltage signals, a combination of said short voltage signal and said long voltage signal; or a series of pulse signals consecutively generated within a signal time length;

wherein when said microcontroller receives said at least one message carrying sensing signal, said microcontroller operates to activate a corresponding process for performing said at least one illumination performance of illumination performance control modes including at least an on/off switch control mode, a dimming control mode, an illumination level switching control mode and a delay shutoff control mode;

wherein said LED load in conjunction with an adequate level setting of said DC power is designed with a combination of in series and/or in parallel connections such that an electric current passing through each LED of said LED load remains at an adequate level, and a voltage V across each LED complies with a constraint of $V_{th} < V < V_{max}$ featuring electrical characteristics of said LED:

wherein $V_{th}$ is a threshold voltage required to trigger said LED to start emitting light and $V_{max}$ is a maximum operating voltage across said LED to avoid a thermal damage to LED construction;

wherein when said LED load is configured with a plurality of N number LEDs or N sets of parallel connected LEDs electrically connected in series, a working voltage $V_N$ across said LED load is confined in a domain between a minimum voltage equal to the sum of said threshold voltages of all LEDs or sets of parallel connected LEDs electrically connected in series and a maximum voltage equal to the sum of said maximum operating voltages of all LEDs or sets of parallel connected LEDs electrically connected in series, identically expressed as $N \times V_{th} < V_N < N \times V_{max}$; and wherein said microcontroller is a programmable integrated circuit device or an application specific integrated circuit for generating said control signal.

12. The lighting apparatus according to claim 11, wherein said at least one detection device is configured with a touchless interface for detecting said at least one external control signal and converting said at least one external control signal into said at least one message carrying sensing signal interpretable to said microcontroller.

13. The lighting apparatus according to claim 12, wherein said touchless interface is an active infrared ray sensor comprising a transmitter to emit infrared light into an area to form a defined detection zone and a receiver to detect said infrared light reflected from an object entering, staying in and leaving said defined detection zone, wherein when an object enters and leaves said defined detection zone, a circuitry responsively generates a first voltage sensing signal with a time length corresponding to a time interval of said object entering and staying in said defined detection zone; wherein when said object leaves said defined detection zone, said circuitry delivers a second voltage signal, said first voltage sensing signal with said signal time length is said at least one message carrying sensing signal to be delivered to said microcontroller for performing said at least one illumination performance of said illumination performance control modes including at least said on/off switch control mode, said dimming control mode, said illumination level switching control mode and said delay shutoff control mode.

14. The lighting apparatus according to claim 12, wherein said touchless interface is a passive infrared ray motion sensor electrically coupled to said microcontroller for detecting and converting a motion signal generated by an intruder into said at least one message carrying sensing signal with said at least one signal format interpretable to said microcontroller for performing said at least one illumination performance of said illumination performance control modes including at least said on/off switch control mode, said dimming control mode, said illumination level switching control mode and said delay shutoff control mode.

15. The lighting apparatus according to claim 12, wherein said touchless interface is an ultrasonic wave motion sensor comprising a transmitter to transmit ultrasonic wave into an area to form a detection zone and a receiver to detect said ultrasonic wave reflected from an intruder entering said detection zone for detecting a motion signal and converting said motion signal into said at least one message sensing signal with said at least one signal format interpretable to said microcontroller for performing said at least one illumination performance of said illumination performance control modes including at least said on/off switch control mode, said dimming control mode, said illumination level switching control mode and said delay shutoff control mode.

16. The lighting apparatus according to claim 12, wherein said touchless interface is a microwave motion sensor electrically coupled with said microcontroller, comprising a transmitter to transmit microwave signal into an area to form a detection zone and a receiver to detect said microwave signal reflected from an intruder entering said detection zone for detecting a motion signal and converting said motion signal into said at least one message sensing signal with said at least one signal format interpretable to said microcontroller for performing said at least one illumination performance of said illumination performance control modes including at least said on/off switch control mode, said dimming control mode, said illumination level switching control mode and said delay shutoff control mode.

17. The lighting apparatus according to claim 12, wherein said touchless interface is a wireless remote control device electrically coupled to said microcontroller to receive and convert a wireless external control signal into said at least one message carrying sensing signal with said at least one signal format interpretable to said microcontroller for performing said at least one illumination performance of said illumination performance control modes including at least said on/off switch control mode, said dimming control mode, said illumination level switching control mode and said delay shutoff control mode.

18. The lighting apparatus according to claim 17, wherein said wireless external control signal is a Blue Tooth wireless signal, a Wi-Fi wireless signal, a microwave wireless signal or a millimeter wave wireless signal.

19. The lighting apparatus according claim 18, wherein said wireless external control signal is received from a smart phone or a mobile device, loaded with an application program (APP) or software program operable on a panel screen of said smart phone or said mobile device for operating at least one of said illumination performance control modes of said lighting apparatus.

20. The lighting apparatus according to claim 18, wherein said microcontroller comprises a memory for saving or installing an application program (APP) or a software program, wherein said application program or said software program from an internet or a cloud server is downloaded for interpreting and executing said at least one message sensing signal from said wireless remote control device.

21. The lighting apparatus according to claim 18, wherein said wireless external control signal is received from a smart speaker to read, execute and convert a voice instruction into said wireless external control signal.

22. The lighting apparatus according to claim 11, wherein said wireless signal transmitter is a Blue Tooth wireless signal transmitter, a Wi-Fi wireless signal transmitter, a microwave wireless signal transmitter or a millimeter wave wireless signal transmitter.

23. The lighting apparatus according claim 12, wherein said touchless interface is a photo sensor for detecting a lumens level of a light intensity in a detection area and converting said lumens level into said at least one message sensing signal with said at least one signal format interpretable to said microcontroller for performing said at least one illumination performance of said illumination performance control modes including at least said on/off switch control mode, said dimming control mode, said illumination level switching control mode and said delay shutoff control mode.

24. A lighting apparatus, comprising:
a light emitting unit configured with an LED load including a plurality of LEDs;
a loading and power control unit comprising a microcontroller and a controllable switching circuitry;
a light sensing unit, electrically coupled with said microcontroller, for detecting a lumens value of an ambient light in a detection area for controlling an on or off illumination performance of said light emitting unit;
a motion sensing unit, electrically coupled with said microcontroller, for detecting a motion signal to perform a high level illumination for a predetermined time duration; and
a wireless signal receiver, electrically coupled with said microcontroller, for receiving at least one wireless external control signal and convert said at least one wireless external control signal into at least one message carrying sensing signal with at least one signal format interpretable to said microcontroller for executing at least one illumination performance of illumination performance control modes including at least an on/off switch control mode, a dimming control mode, a delay shutoff control mode, a light sensitivity control mode, a motion sensitivity control mode or a switching control mode between a motion sensing illumination mode and a dusk to dawn illumination mode;
wherein said microcontroller comprises a memory for saving or installing an application program (APP) or a software program, wherein said application program or said software program from an internet or a cloud server is downloaded for interpreting and executing said at least one message carrying sensing signal from said wireless signal receiver;
wherein said controllable switching circuitry electrically connected between said LED load and a power source comprises at least one semiconductor switching element for controlling and delivering a DC power from said power source to said LED load;
wherein said microcontroller is electrically coupled with said at least one semiconductor switching element, said light sensing unit, said motion sensing unit and said wireless signal receiver;
wherein said microcontroller outputs a control signal to control a conduction state of said at least one semiconductor switching element according to a light sensing signal from said light sensing unit or according to a motion sensing signal from said motion sensing unit;
wherein when said at least one semiconductor switching element is in said conduction state, said microcontroller further control a conduction rate of said at least one semiconductor switching element to control an electric power transmission level from said power source to said LED load according to said at least one signal format of said at least one message carrying sensing signal received from said wireless signal receiver or form said light sensing signal or from said motion sensing signal;
wherein said signal format of said at least one message carrying sensing signal is a short voltage signal with a signal time length equal to or shorter than a preset time interval, a long voltage signal with a signal time length longer than said preset time interval, a constant voltage signal with a voltage value, a plurality of short voltage signals, a plurality of long voltage signals, a combination of said short voltage signal and said long voltage signal, or a series of pulse signals consecutively generated within a signal time length;
wherein when said microcontroller receives said at least one message carrying sensing signal, said microcontroller operates to activate a corresponding process according to said signal format of said at least one message carrying sensing signal to perform said at least one illumination performance of said illumination performance control modes including at least said on/off switch control mode, said dimming control mode, an illumination level switching control mode, said delay shutoff control mode, said light sensitivity control mode, said motion sensitivity control mode, and said switching control mode between said motion sensing illumination mode and said dusk to dawn illumination mode;
wherein said LED load in conjunction with an adequate level setting of said DC power is designed with a combination of in series and/or in parallel connections such that an electric current passing through each LED of said LED load remains at an adequate level, and a voltage V across each LED complies with a constraint of $V_{th} < V < V_{max}$ featuring electrical characteristics of said LED;
wherein $V_{th}$ is a threshold voltage required to trigger said LED to start emitting light and $V_{max}$ is a maximum operating voltage across said LED to avoid a thermal damage to LED construction;
wherein when said LED load is configured with a plurality of N number LEDs or N sets of parallel connected LEDs electrically connected in series, a working voltage $V_N$ across said LED load is confined in a domain between a minimum voltage equal to the sum of said threshold voltages of all LEDs or sets of parallel connected LEDs electrically connected in series and a maximum voltage equal to the sum of said maximum operating voltages of all LEDs or sets of parallel connected LEDs electrically connected in series, identically expressed as $N \times V_{th} < V_N < N \times V_{max}$; and
wherein said microcontroller is a programmable integrated circuit device or an application specific integrated circuit for generating the control signal.

25. The lighting apparatus according to claim 24, wherein at dusk when said lumens value of said ambient light is lower than a first predetermined value said microcontroller operates to activate said motion sensing unit;
  wherein when said motion signal is detected by said motion sensing unit, said microcontroller operates to conduct said at least one semiconductor switching device to perform said high level illumination for said predetermined time duration;
    wherein at dawn when said lumens value of said ambient light is higher than a second predetermined value said microcontroller operates to switch off said light emitting unit.

26. The lighting apparatus according to claim 25, wherein at dusk when said motion sensing unit is activated said microcontroller operates to control said at least one semiconductor switching device to deliver a low level electric power to said light emitting unit to generate a low level illumination; wherein when said motion signal is detected by said motion sensing unit, said microcontroller operates to control said at least one semiconductor switching device to deliver a high level electric power to said light emitting unit to perform said high level illumination for said predetermined time duration.

27. The lighting apparatus according to claim 24, wherein said at least one wireless external control signal is a Blue Tooth wireless signal, a Wi-Fi wireless signal, a microwave wireless signal or a millimeter wave wireless signal.

28. The lighting apparatus according to claim 24, wherein said at least one wireless external control signal is received from a smart phone or a mobile device, loaded with an application program (APP) or software program operable on a panel screen of said smart phone or said mobile device for controlling to perform said at least one illumination performance of said lighting apparatus.

29. The lighting apparatus according to claim 24, wherein said at least one wireless external control signal is received from a smart speaker to interpret, execute and convert a voice instruction into said wireless external control signal.

30. The lighting apparatus according to claim 24, wherein said motion sensor is an active infrared ray motion sensor.

31. The lighting apparatus according to claim 24, wherein said motion sensor is a passive infrared ray motion sensor.

32. The lighting apparatus according to claim 24, wherein said motion sensor is a microwave motion sensor.

33. The lighting apparatus according to claim 24, wherein said motion sensor is an ultrasonic motion sensor.

34. A lighting apparatus, comprising:
  a light emitting unit configured with an LED load including a plurality of LEDs;
  a loading and power control unit including at least a microcontroller and a controllable switching circuitry;
  at least one detection device, configured with a direct touch interface, for detecting an external control signal and converting said external control signal into at least one first message carrying sensing signal with at least one signal format interpretable to said microcontroller for activating at least one illumination performance of illumination performance control modes including at least an on/off switch control mode, a dimming control mode, a delay shutoff control mode, a light sensitivity control mode, a detection sensitivity control mode, a switching control mode between operating two different illumination modes; and
  a wireless signal receiver, electrically coupled with said microcontroller, for receiving a wireless external control signal and convert said wireless external control signal into at least one second message carrying sensing signal with said at least one signal format interpretable to said microcontroller for activating said at least one illumination performance of said illumination performance control modes including at least said on/off switch control mode, said dimming control mode, said delay shutoff control mode, said light sensitivity control mode, said detection sensitivity control mode and said switching control mode between operating two different illumination modes;
  wherein said microcontroller comprises a memory for saving or installing an application program (APP) or a software program, wherein said application program or said software program from an internet or a cloud server is downloaded for interpreting and executing said at least one second message sensing signal from said wireless signal receiver;
  wherein said switching circuitry electrically connected between said LED load and a power source comprises at least one semiconductor switching element for controlling and delivering a DC power from said power source to said LED load;
  wherein said microcontroller is electrically coupled with said at least one semiconductor switching element, said at least one detection device and said wireless signal receiver;
  wherein said microcontroller outputs a control signal to control a conduction state of said at least one semiconductor switching element according to said at least one first message sensing signal or said at least one second message sensing signal;
  wherein when said at least one semiconductor switching element is in said conduction state, said microcontroller further control a conduction rate of said at least one semiconductor switching element to control an electric power transmission level from said power source to said LED load according to said at least one first message carrying sensing signal received from said at least one detection device or according to said at least one second message sensing signal from said wireless signal receiver;
  wherein said at least one signal format of said at least one first message carrying sensing signal or said at least one second message sensing signal is a short voltage signal with a signal time length equal to or shorter than a preset time interval, a long voltage signal with a signal time length longer than said preset time interval, a constant voltage signal with a voltage value, a plurality of said short voltage signals, a plurality of said long voltage signals, a combination of said short voltage signal and said long voltage signal or a series of pulse signals consecutively generated within a signal time length;
  wherein when said microcontroller receives said at least one first message carrying sensing signal or said at least one second message sensing signal, said microcontroller operates to activate a corresponding process according to said at least one signal format of said at least one first message carrying sensing signal or said at least one second message sensing signal to perform said at least one illumination performance of said illumination performance control modes;
  wherein said microcontroller is a programmable integrated circuit device or an application specific integrated circuit for generating the control signal;
  wherein said LED load in conjunction with an adequate level setting of said DC power is designed with a combination of in series and or in parallel connections such that an electric current passing through each LED of said LED load remains at an adequate level, and a voltage V across each LED complies with a constraint of $V_{th} < V < V_{max}$ featuring electrical characteristics of said LED;

wherein $V_{th}$ is a threshold voltage required to trigger said LED to start emitting light and $V_{max}$ is a maximum operating voltage across said LED to avoid a thermal damage to LED construction;

wherein when said LED load is configured with a plurality of N number LEDs or N sets of parallel connected LEDs electrically connected in series, a working voltage $V_N$ across said LED load is confined in a domain between a minimum voltage equal to the sum of said threshold voltages of all LEDs or sets of parallel connected LEDs electrically connected in series and a maximum voltage equal to said sum of the maximum operating voltages of all LEDs or sets of parallel connected LEDs electrically connected in series, identically expressed as $N \times V_{th} < V_N < N \times V_{max}$; and wherein said microcontroller is a programmable integrated circuit device or an application specific integrated circuit for generating said control signal.

35. The lighting apparatus according to claim 34, wherein said direct touch interface of said at least one detection device is a push button switch, a touch sensor switch, a power interruption detection circuitry, a phase controller or a voltage divider.

* * * * *